United States Patent
Vadi et al.

(10) Patent No.: US 7,218,137 B2
(45) Date of Patent: May 15, 2007

(54) RECONFIGURATION PORT FOR DYNAMIC RECONFIGURATION

(75) Inventors: Vasisht Mantra Vadi, San Jose, CA (US); David P. Schultz, San Jose, CA (US); John D. Logue, Placerville, CA (US); John McGrath, Cork (IE); Anthony Collins, Dublin (IE); F. Erich Goetting, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 455 days.

(21) Appl. No.: 10/837,331

(22) Filed: Apr. 30, 2004

(65) Prior Publication Data

US 2005/0248364 A1 Nov. 10, 2005

(51) Int. Cl.
*H03K 19/173* (2006.01)

(52) U.S. Cl. .............................. 326/38; 326/39; 326/41

(58) Field of Classification Search ............ 326/38–41, 326/47
See application file for complete search history.

(56) References Cited

U.S. PATENT DOCUMENTS

| | | | |
|---|---|---|---|
| 5,586,299 | A | 12/1996 | Wakerly |
| 5,774,474 | A | 6/1998 | Narayanan et al. |
| 5,999,480 | A | 12/1999 | Ong et al. |
| 6,034,542 | A | 3/2000 | Ridgeway |
| 6,201,728 | B1 | 3/2001 | Narui et al. |
| 6,204,687 | B1 | 3/2001 | Schultz et al. |
| 6,304,101 | B1 * | 10/2001 | Nishihara .................... 326/41 |
| 6,732,354 | B2 | 5/2004 | Ebeling et al. |
| 6,836,839 | B2 | 12/2004 | Master et al. |
| 6,851,047 | B1 | 2/2005 | Fox et al. |
| 2002/0138716 | A1 | 9/2002 | Master et al. |
| 2003/0034848 | A1 | 2/2003 | Norman et al. |
| 2003/0105949 | A1 | 6/2003 | Master et al. |
| 2003/0154357 | A1 | 8/2003 | Master et al. |
| 2004/0030736 | A1 | 2/2004 | Scheuermann |
| 2004/0078403 | A1 | 4/2004 | Scheuermann et al. |
| 2004/0117755 | A1 * | 6/2004 | Blodget et al. ............... 716/17 |
| 2005/0044344 | A1 | 2/2005 | Stevens |

FOREIGN PATENT DOCUMENTS

EP 0 748 051 A 12/1996

OTHER PUBLICATIONS

Raphael David et al.; "DART: A Dynamically Reconfigurable Architecture Dealing with Future Mobile Telecommunications Constraints"; Copyright 2002 IEEE; pp. 1-8, no month.

(Continued)

*Primary Examiner*—Anh Q. Tran
(74) *Attorney, Agent, or Firm*—W. Eric Webostad

(57) ABSTRACT

Method and apparatus for dynamic configuration of function block logic of an integrated circuit is described. The integrated circuit includes a reconfiguration port coupled to a controller. The controller is coupled to an array of memory cell. A portion of the array of memory cells is coupled for read/write communication with the controller, and another portion of the array of memory cells is not coupled for read/write communication with the controller. The portion of the array of memory cells is configurable at an operational frequency of the integrated circuit for dynamic reconfiguration of the function block logic of the integrated circuit.

31 Claims, 26 Drawing Sheets

OTHER PUBLICATIONS

U.S. Appl. No. 10/377,857, filed Feb. 28, 2003, Blodget et al.
U.S. Appl. No. 10/683,944, filed Oct. 10, 2003, Young.
U.S. Appl. No. 10/806,697, filed Mar. 22, 2004, Voogel et al.
U.S. Appl. No. 10/836,841, filed Apr. 30, 2004, Vadi et al.
U.S. Appl. No. 10/836,960, filed Apr. 30, 2004, Vadi et al.
U.S. Appl. No. 10/836,961, filed Apr. 30, 2004, Vadi et al.
U.S. Appl. No. 10/837,330, filed Apr. 30, 2004, Goetting et al.

Xilinx, Inc.; DS031; "Virtex-II 1.5V Field-Programmable Gate Arrays"; Advance Product Specification; Oct. 2, 2001; (v1.70; available from Xilinx, Inc., 2100 Logic Drive, San Jose, California 95124; pp. 37, 90, and 387.

Xilinx, Inc.; Virtex-II Platform FPGA Handbook; Dec. 3, 2001; available from Xilinx, Inc., 2100 Logic Drive, San Jose, California 95124; p. 387.

* cited by examiner

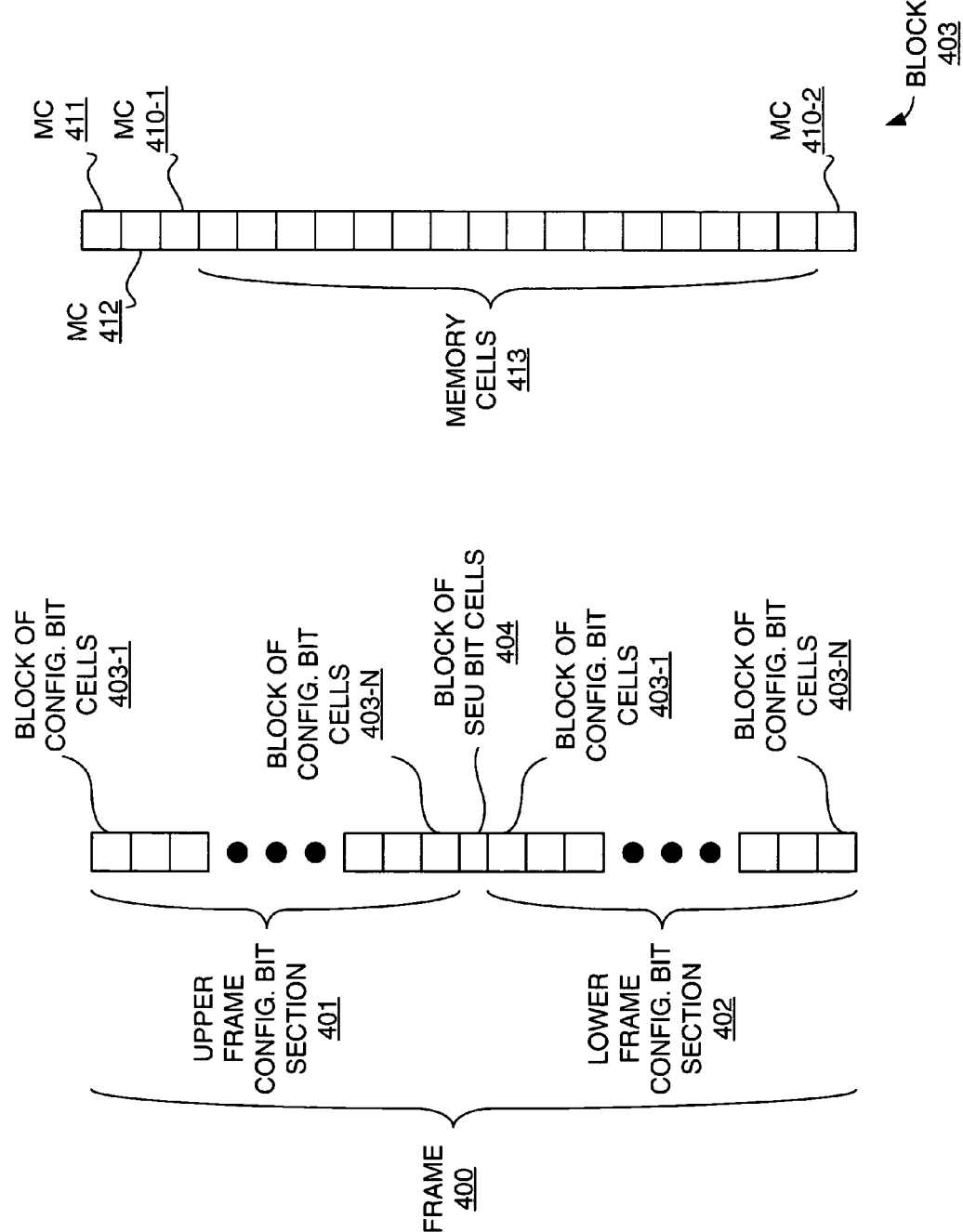

| GMASK_B 505 | Q_B 501 | A 302 | A_LOC 502 |
|---|---|---|---|
| 1 | X | 1 OR 0 | A |
| X | 1 | 1 OR 0 | A |
| 0 | 0 | X (1 OR 0) | 0 |

FIG. 9

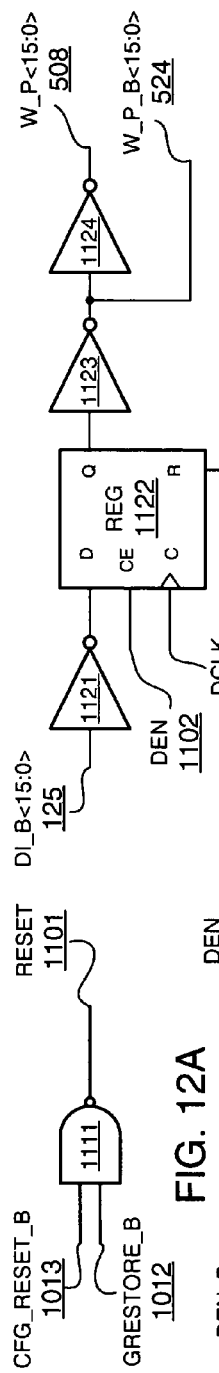
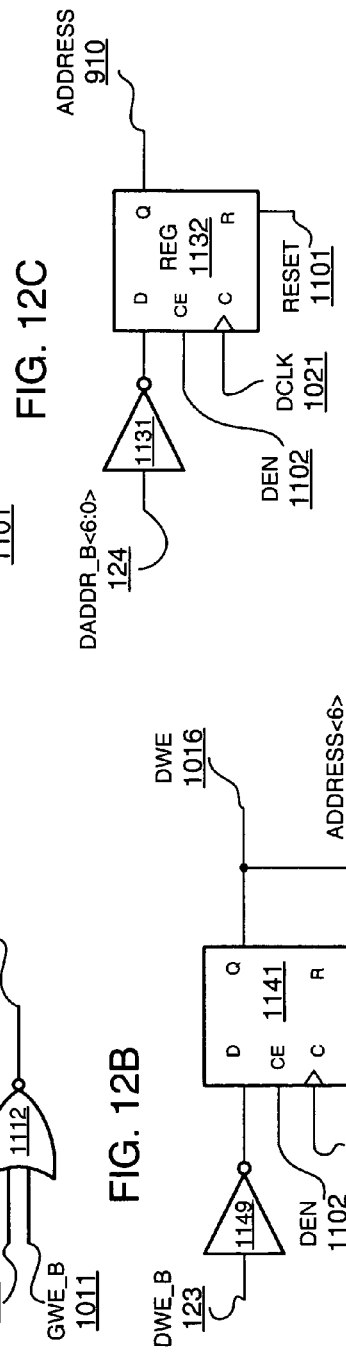
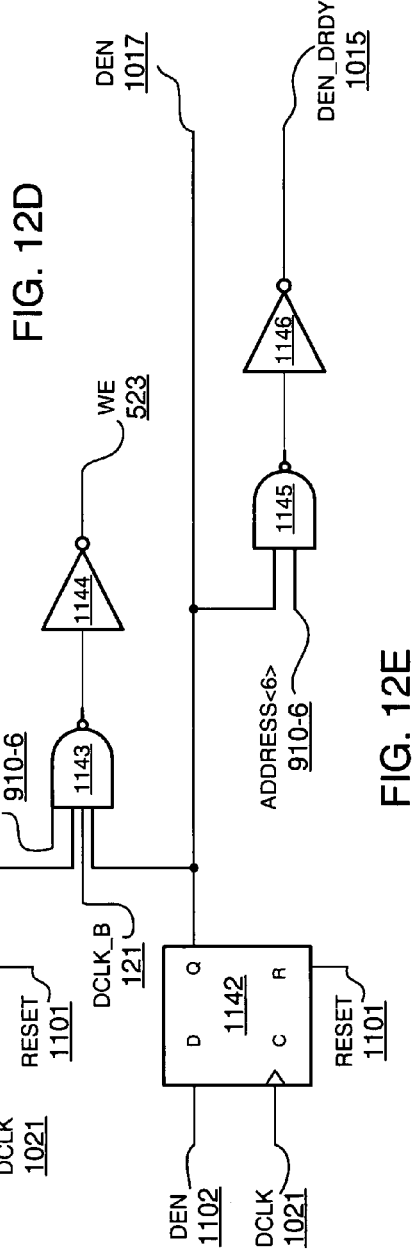
FIG. 12A
FIG. 12B
FIG. 12C
FIG. 12D
FIG. 12E

RECONFIGURATION PORT FOR DYNAMIC RECONFIGURATION

FIELD OF THE INVENTION

One or more aspects of the invention relate generally to a reconfiguration port and more particularly, to a reconfiguration port for dynamic reconfiguration of an integrated circuit.

BACKGROUND OF THE INVENTION

Programmable logic devices ("PLDs") exist as a well-known type of integrated circuit ("IC") that may be programmed by a user to perform specified logic functions. There are different types of programmable logic devices, such as programmable logic arrays ("PLAs") and complex programmable logic devices ("CPLDs"). One type of programmable logic device, called a field programmable gate array ("FPGA"), is very popular because of a superior combination of capacity, flexibility, time-to-market, and cost.

An FPGA typically includes an array of configurable logic blocks ("CLBs") and programmable input/output blocks ("IOBs"). The CLBs and IOBs are interconnected by a programmable interconnect structure. The CLBs, IOBs, and interconnect structure are typically programmed by loading a stream of configuration data ("bitstream") into internal configuration memory cells that define how the CLBs, IOBs, and interconnect structure are configured. CLBs and IOBs form the programmable part of an FPGA referred to as the "FPGA fabric", which is subject to program control of the configuration memory cells.

CLBs and IOBs may be interconnected via widely distributed on-chip ("global") routing resources or regionally specific on-chip ("local") routing resources of an FPGA, such as one or more traces. Moreover, both global and local resources may be used to distribute signals, such as clock signals. A global routing resource may be programmatically coupled to another global routing resource or a local routing resource, or a local routing resource may be programmatically coupled to another local routing resource using what is known as a programmable interconnect point ("PIP"). Conventionally, PIPs have been programmed or reprogrammed using an externally provided configuration bitstream to program programmable logic. Some other types of circuitry that may be included in an FPGA are transceivers, digital clock managers ("DCMs"), and memory controllers.

DCMs may be programmed for providing any of a variety of clock signals. For example, clock signals of different frequencies or different phase relationships may be provided from a reference clock input to a DCM. Furthermore, DCMs may be programmed for providing such a variety of clock signals. Conventionally, DCMs have been programmed or reprogrammed using an externally provided configuration bitstream to program programmable logic.

In addition to configuration memory cells, groups of system memory cells, sometimes referred to as block random access memories ("BRAMs"), may be included in an FPGA. Like configuration memory cells, such BRAMS conventionally are formed using a standard six transistor ("6T") static random access memory ("SRAM") memory cell. However, known forms of either or both static and dynamic random access memory ("DRAM") memory cells, as well as magnetoresistive random access memory cells ("MRAM") and flash memory cells, may be included in FPGAs. Conventionally configuration memory cells, as well as system memory cells, were programmed and reprogrammed using an externally provided configuration bitstream.

FPGAs include transceivers, which may be configured for "single-ended" or "differential" signaling. A more recent trend is to provide high-speed transceivers, such as multi-gigabit transceivers ("MGTs"). Transceivers may be programmed to conform to any of a variety of communication standards by programming communication signaling parameters, such as duty cycle, frequency, and preemphasis, among other known communication signaling parameters. Conventionally, transceivers were programmed and reprogrammed using an externally provided configuration bitstream.

Accordingly, it should be appreciated that there are many circuits in a programmable logic device that may be programmed to provide user defined functionality. Furthermore, modern day programmable logic devices may include one or more other devices, such as one or more digital signal processors and microprocessors, among other known integrated circuit devices. For example, microprocessors may be embedded cores ("hard processors") or programmed into CLBs ("soft processors"). While instructions for such other devices may reside in embedded memory, such as one or more BRAMs, such other devices were subject to there surroundings, namely, configuration of functional blocks programmed or reprogrammed using an externally provided configuration bitstream.

As mentioned above, conventionally an FPGA is programmed by supplying an external bitstream to configure the FPGA. Classically, once an FPGA was configured, it was seldom reconfigured, including without limitation configuration of resources previously not programmed, during operation. This had at least in part to do with having a relatively slow internal access port ("ICAP") for reconfiguration. Notably, it should be appreciated that an ICAP conventionally may be used to configure or reconfigure an FPGA, as such an ICAP has access to all of the FPGA fabric for purposes of configuration or reconfiguration. However, an ICAP port runs at approximately one-third or less the frequency of which the FPGA may be run. Further impacting the ability to quickly achieve reconfiguration, an ICAP port has a minimum bit reconfiguration "granularity" of one frame. Thus, for example, if only one bit in a 1296 bit frame had to be changed, all 1296 bits were processed to change the one bit.

Accordingly, it would be desirable and useful to provide an integrated circuit having internal dynamic reconfiguration capability that is substantially faster than that afforded by an ICAP.

SUMMARY OF THE INVENTION

An aspect of the invention is an integrated circuit, comprising: a reconfiguration port; a controller coupled to the reconfiguration port; and an array of memory cells. A portion of the array of memory cells is coupled for read/write communication with the controller, and another portion of the array of memory cells is not coupled for read/write communication with the controller. The portion of the array of memory cells is configurable at an operational frequency of the integrated circuit for dynamic reconfiguration of a function block of the integrated circuit.

Another aspect of the invention is a method for configuring a function block, comprising: configuring an integrated circuit device including the function block; operating the integrated circuit device; and while operating the integrated circuit device, reconfiguring the function block. The reconfiguring includes: accessing a reconfiguration port internal to the integrated circuit device; and writing configuration information via the reconfiguration port to configuration memory cells for the reconfiguring of the function block, where the configuration memory cells are dual ported. A port of the configuration memory cells is for configuring configurable logic of the integrated circuit device, and another port of the configuration memory cells is for configuring the function block, the writing via the other port of the configuration memory cells.

Yet another aspect of the invention is an integrated circuit, comprising: a reconfiguration port interface internal to the integrated circuit for communication; a controller coupled to the reconfiguration port interface, the controller for controlling the communication; a read/write interface coupled to the controller for reading and writing configuration information; an array of storage cells coupled to the read/write interface for storing the configuration information; and a function logic block coupled to the array of storage cells and configurable for providing any of a variety of functions. The array of storage cells is programmable for configuring the function logic block to provide any of the variety of functions, and the reconfiguration port interface is for providing the configuration information to the array of storage cells for programming at least a portion of the array of storage cells for dynamic configuration of the function logic block at a frequency of operation of the integrated circuit.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 5A is a block diagram depicting an exemplary embodiment of a memory cell frame architecture.

FIG. 5B is a block diagram depicting an exemplary of a block of memory cells ("block").

FIG. 9 is a table diagram depicting an exemplary embodiment of states of inputs and in response the output of the masking circuit of FIG. 8.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

Figure 1A:
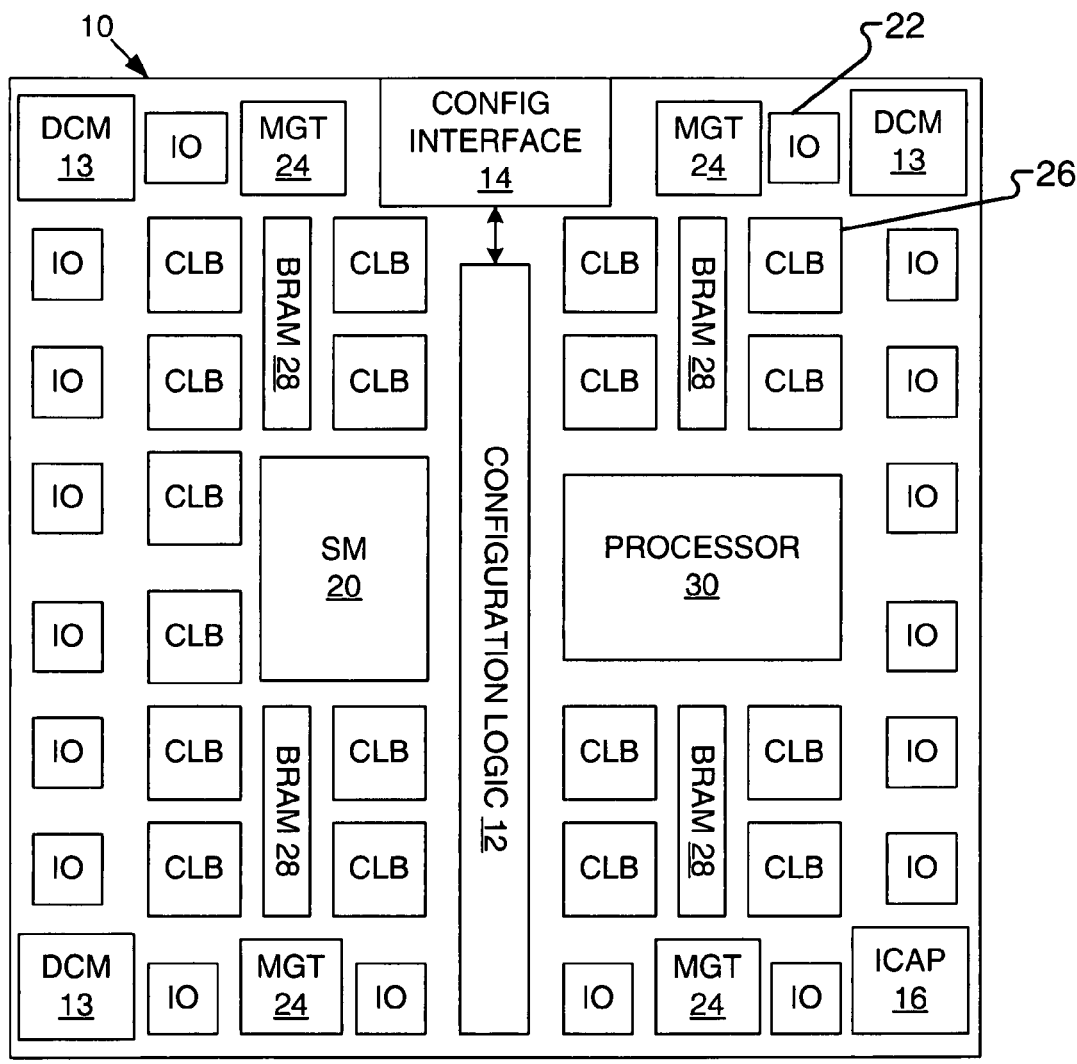
FIG. 1A is a high-level block diagram depicting an exemplary embodiment of a Field Programmable Gate Array ("FPGA") with a "ring" architecture.

FIG. 1A is a high-level block diagram depicting an exemplary embodiment of a Field Programmable Gate Array ("FPGA") 10. FPGA 10 is an example of a software configurable integrated circuit. However, other Programmable Logic Device ("PLD") integrated circuits other than Field Programmable Gate Arrays ("FPGAs"), including complex PLDs ("CPLD") and other integrated circuits with configurable logic, may be used.

FPGA 10 includes configurable logic blocks ("CLBs") 26, programmable input/output blocks ("IOBs") 22, memory, such as block random access memory 28, delay lock loops (DLLs) and multiply/divide/de-skew clock circuits which collectively provide digital clock managers (DCMs) 13, and multi-gigabit transceivers ("MGTs") 24. An external memory may be coupled to FPGA 10 to store and provide a configuration bitstream to configure FPGA 10, namely, to program one or more configuration memory cells to configure CLBs 26 and IOBs 22. Notably, IOBs 22, as well as MGTs 24, are disposed in a ring or ring-like architecture forming a perimeter of I/Os around CLBs 26 of FPGA 10.

Additionally, FPGA 10 may include an Internal Configuration Access Port ("ICAP") 16, an embedded processor 30, and an embedded system monitor 20.

Though FPGA 10 is illustratively shown with a single embedded processor 30, FPGA 10 may include more than one processor 30. Additionally, known support circuitry, for interfacing with embedded processor 30 may be included in FPGA 10. Furthermore, rather than an embedded processor 30, processor 30 may be programmed into configurable logic such as a "soft" processor 30.

Although FIG. 1A illustratively shows a relatively small number of IOBs 22, CLBs 26 and BRAMs 28, for purposes of example, it should be understood that an FPGA 10 conventionally includes many more of these elements. Additionally, FPGA 10 includes other elements, such as a programmable interconnect structure and a configuration memory array, which are not illustratively shown in FIG. 1A. Additional details regarding an example of an FPGA are described in "Virtex-II™ Pro, Platform FPGA Handbook", (Oct. 14, 2002) which includes "Virtex-II Pro™ Platform FPGA Documentation" (March 2002) "Advance Product Specification," "Rocket I/O Transceiver User Guide", "PPC 405 User Manual" and "PPC 405 Processor Block Manual" available from Xilinx, Inc., 2100 Logic Drive, San Jose, Calif. 95124.

FPGA 10 in one embodiment may be configured and reconfigured (after initially being configured) in response to a configuration information (commands and data) bitstream, that is loaded into a configuration memory array of FPGA 10, either externally, from an external memory, e.g., a read-only memory ("ROM"), via configuration interface 14 and configuration logic 12 or internally, via the ICAP 16 which is also connected to the configuration logic 12 (not shown). Configuration interface 14 can be, for example, a select map interface, a Joint Test Action Group ("JTAG") interface, or a master serial interface.

The ICAP 16 is used for internal or self-reconfiguration of the FPGA 10. For example, after initial configuration of the FPGA by a configuration bit stream being sent by an external PROM (programmable ROM) to the configuration interface 14, the configured FPGA 10 is put in operational use. Next, part of configured FPGA 10 may be reconfigured under control of the embedded processor 30 using the ICAP 16. This self-reconfiguration is further discussed in a co-pending patent application, Ser. No. 10/377,857, entitled "Reconfiguration of a Programmable Logic Device Using Internal Control", by Brandon J. Blodget, et. al, filed Feb. 28, 2003, which is incorporated by reference herein in its entirety.

FPGA 10 in another embodiment of the present invention can receive the configuration bitstream via the configuration interface 14 (external configuration or reconfiguration), ICAP 16 (internal reconfiguration), or in addition, by one or more dynamic reconfiguration ports (not shown). Each dynamic reconfiguration port (DRPORT) directly addresses its own group of configuration memory cells (via a controller) for internal reconfiguration without going through the configuration logic 12. This is different than using configuration interface 14 or ICAP 16, which must go though the configuration logic 12 to get to the configuration memory cells.

With renewed reference to FIG. 1A, configuration memory may include columns of memory cells, where each column includes a plurality of bits. Configuration data is conventionally divided out into data frames. Configuration data may be loaded into the configuration memory array one frame at a time via configuration interface 14 or ICAP 16, or in sub-frame increments via a dynamic reconfiguration port.

Figure 1B:
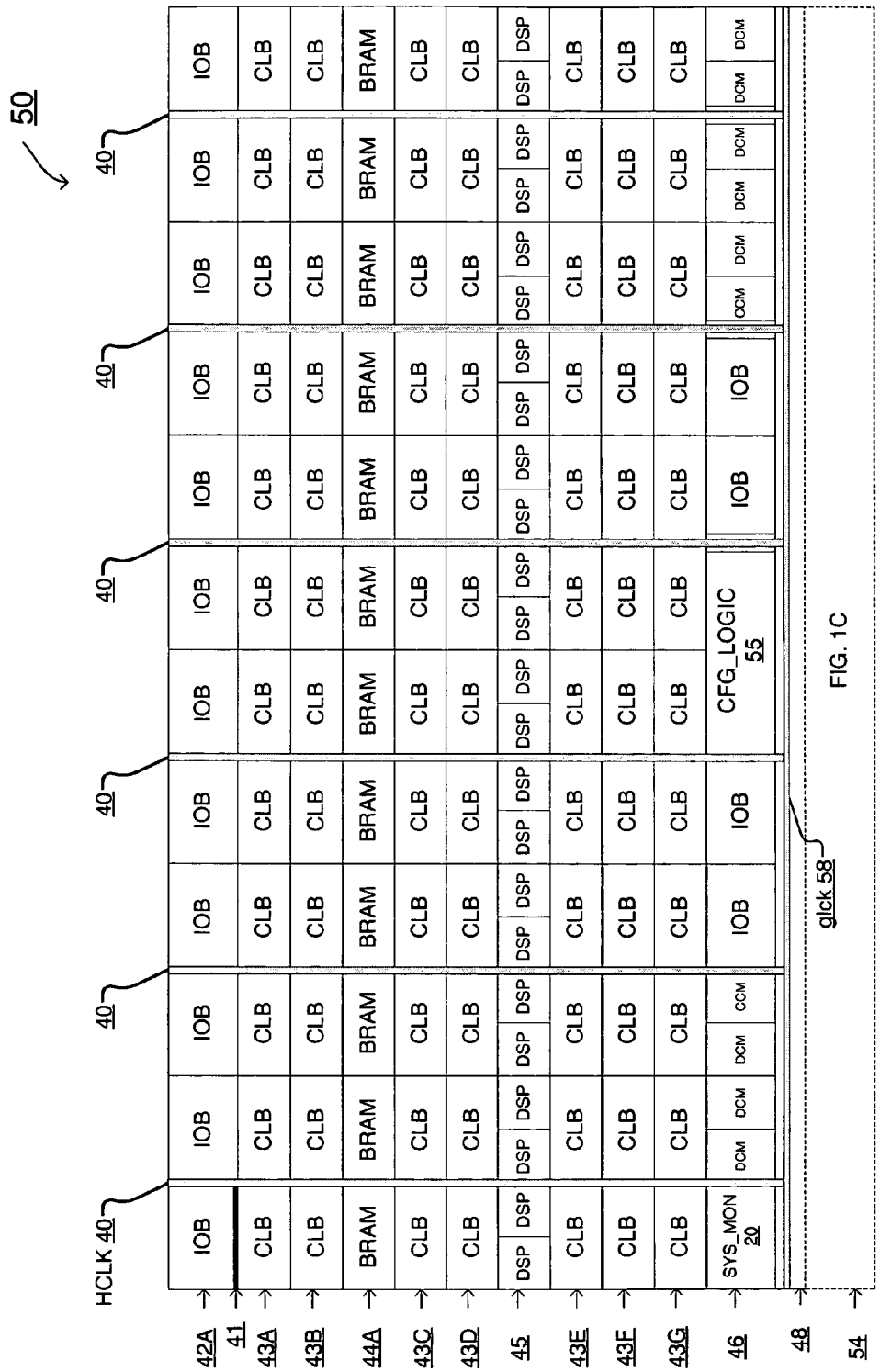
FIGS. 1B and 1C are high-level block diagrams depicting an exemplary embodiment of an FPGA with a "columnar" architecture.
Figure 1C:
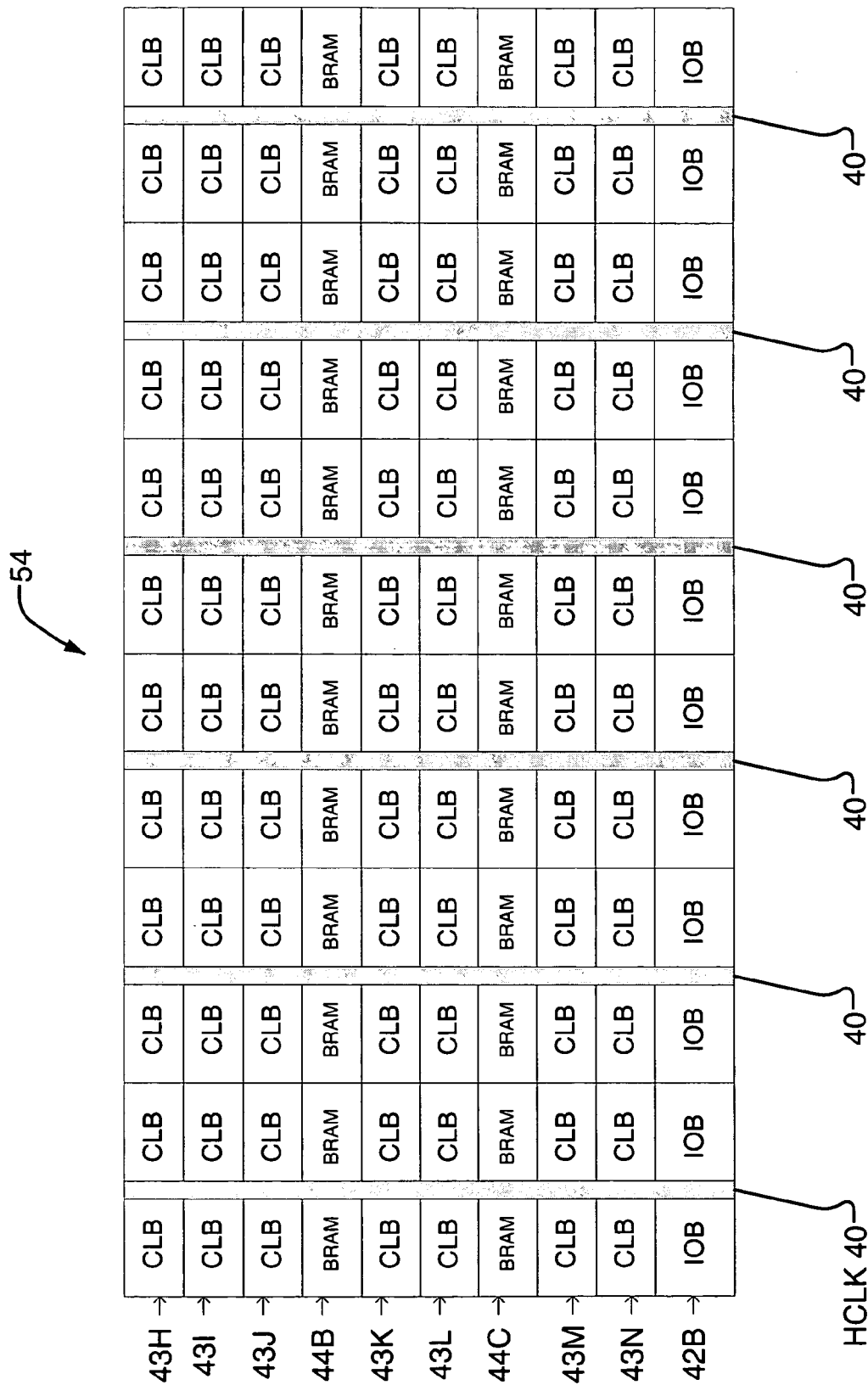
Figure 1D:
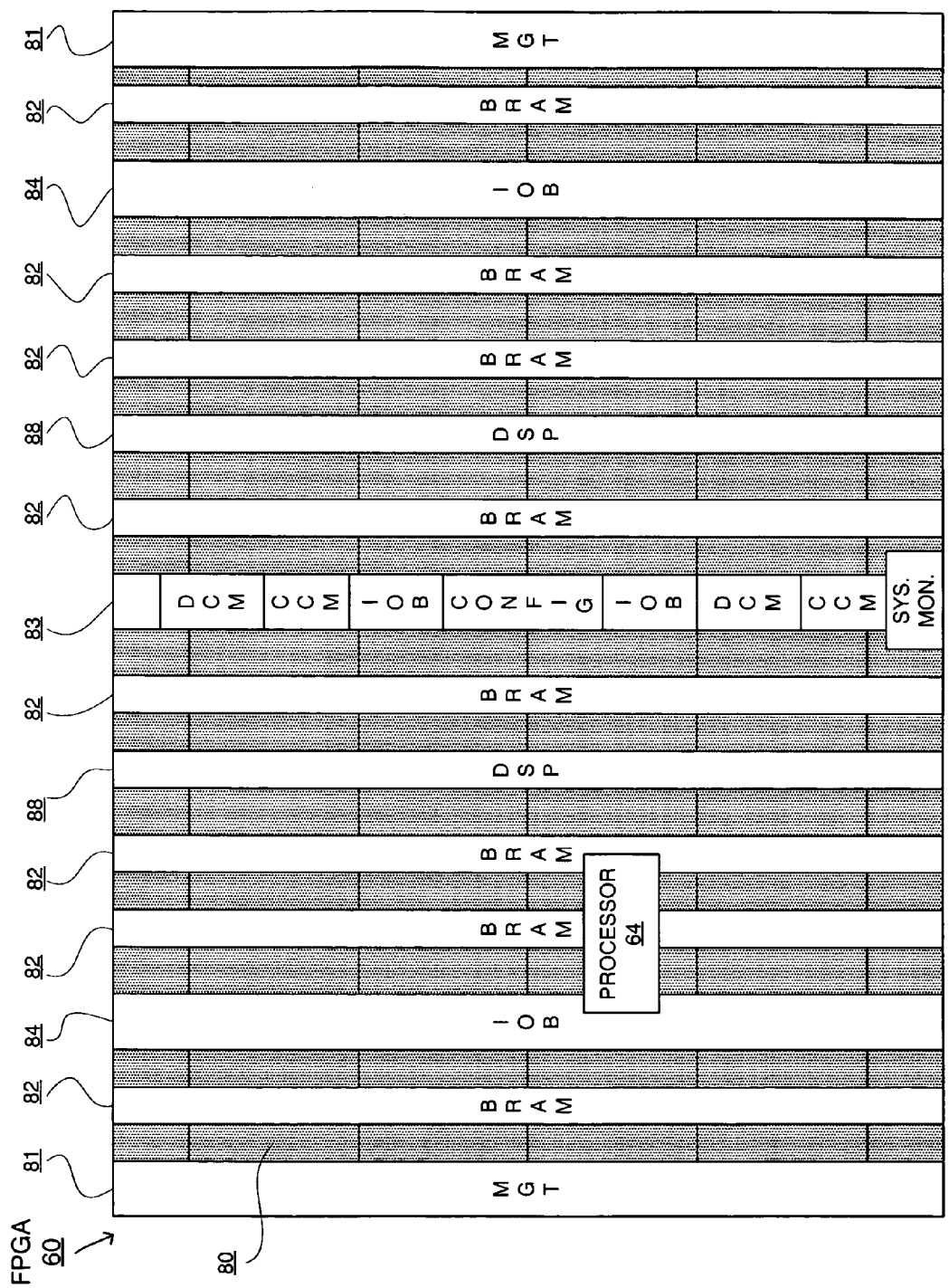
FIG. 1D is a high-level block diagram depicting another exemplary embodiment of an FPGA with a "columnar" architecture and with an embedded processor.

FIGS. 1B and 1C are high-level block diagrams depicting an exemplary embodiment of an FPGA 50 with a "columnar" architecture. FIG. 1B illustratively shows a top portion of FPGA 50, and FIG. 1C is the bottom portion of FPGA 50 illustratively shown in FIG. 1B. FIG. 1D is a high-level block diagram depicting another exemplary embodiment of an FPGA 60 with a "columnar" architecture and with an embedded processor 64.

FIGS. 1B and 1C in combination provides a simplified block diagram of an FPGA 50 having a columnar architecture, though columns have been transposed for rows. The word "tile" as used herein is an area comprising a) circuitry with one or more programmable functions, including memory, or fixed non-programmable circuitry, and b) programmable interconnections.

CLB tiles 43 are laid out in a two-dimensional array. In this example, each CLB tile 43 includes a portion of a programmable interconnect structure such that at least part of the programmable interconnect structure for FPGA 50 is formed by the various portions of the many CLBs when CLB tiles 43 are formed together for FPGA 50. Also illustrated are block random memory/multiplier (BRAM/Multiplier) tiles 44.

In order to provide input/output circuitry for interfacing FPGA 50 to external logic, IOB tiles 42 are provided in, e.g., rows 46, 42A and 42B of FPGA 50. In this particular example, an input/output interconnect tile (IOI tile) is used to couple an IOB tile to a CLB tile. Reference numeral 41 points to one such IOI tile. IOI tile 41 is disposed between an IOB tile 42 and a CLB tile 43.

Digital Signal Processors ("DSPs") are placed in tile area 45. A generally central tile area 46 may be used for support circuitry. The support circuitry may include, for example, DCMs, CCMs, IOBs, configuration logic 55, encryption/decryption logic, global clock driver circuitry, boundary scan circuitry and system monitor 20.

In this particular example, clock distribution circuitry including the backbone of the global clock tree glck 58 is located in area 48. The area 54 represents the bottom half of FPGA 50, which is shown in greater detail in FIG. 1C.

Additional details regarding FPGA 50 may be found in a co-pending patent application Ser. No. 10/683,944, entitled "Columnar Architecture", by Steven P. Young, filed Oct. 10, 2003 which is incorporated by reference herein in its entirety.

With continuing reference to FIG. 1D, columns of MGTs 81 may be disposed on opposite sides of FPGA 60. The columns of CLBs are shown by grayed areas 80. There are also columns of BRAM 82, IOBs 84, and DSP 88. There is shown an embedded processor 64. Center column 83 may include, for example, a system monitor ("SYS. MON."), a digital clock manager ("DCM"), a clock companion module ("CCM"), and configuration logic ("CONFIG."), and IOBs, among others.

The system monitor may include an analog-to-digital converter (ADC) to monitor parameters like temperature and voltage both on-chip and off-chip. The DCM may include circuits to perform clock de-skew, clock phase shifting, clock frequency synthesis, and other clock features. The CCM may include circuits for phase-matched binary clock division and internal clock jitter and skew measurement.

The configuration logic includes logic used to address and load configuration information into configuration memory cells, such as SRAM-based configuration memory cells, during external configuration of FPGA 60. The configuration logic may include configuration registers, boundary scan test circuitry, such as JTAG circuitry, and encryption and/or decryption circuitry used to encrypt and/or decrypt bitstreams of configuration data loaded into and read out of FPGA 60. In FPGAs, configuration memory is used to determine programmable interconnectivity and to specify any of a variety of conditions for functional blocks, among other configuration uses. In an FPGA, there are function blocks, such as MGTs, DCMs, and a System Monitor, among other blocks, where an ability to reprogram dynamically, namely, to change these conditions in these functional blocks while the FPGA is in operational use, would be desirable.

Conventionally, the time to initially configure the configuration memory of an FPGA and to partially reconfigure the configured FPGA is relatively long compared to the operational times of using, for example, a typical decoder formed by configuring CLBs. As an illustration from p. 387 of the Virtex-II Platform FPGA Handbook, Dec. 3, 2001 from Xilinx Inc. of San Jose, Calif. If the FPGA has 404 frames at 832 bits per a frame, then with a 50 MHz configuration clock, it takes about 84 ms to initially configure the FPGA. To reconfigure one frame (832 bits) it would take about 17 usec. If the FPGA has 404 frames at 1472 bits per a frame, then with a 50 MHz configuration clock, it takes about 1.5 ms to initially configure the FPGA. To reconfigure one frame (1472 bits) it would take about 29 usec. At p. 90 of the Virtex-II Platform FPGA Handbook the internal performance of a 16-bit address decoder is about 398 MHz. Thus in one embodiment of the present invention the internal operational clock speed for the operation of a simple design such as a decoder in a configured FPGA is about an order of magnitude faster than the configuration clock speed.

The DRPORT of an exemplary embodiment of the present invention allows reconfiguration of less than a frame of configuration memory without reconfiguring the entire frame and the reconfiguration of less than a frame is done at the internal operational clock speed rather than the configuration clock speed. Thus the data rate of reconfiguring of a group of configuration memory cells less than a frame at the internal operational clock speed of a simple configured circuit is at least one order of magnitude greater than the typical reconfiguration of a frame of configuration memory at the configuration clock speed.

"Dynamic reconfiguration" as used herein means configuring or reconfiguring a set of one or more configuration memory cells at a data rate substantially greater than the traditional reconfiguration of a frame of configuration memory at the configuration clock speed. In one embodiment the operational data rate used by dynamic reconfiguration is at least an order of magnitude greater than the typical reconfiguration data rate.

To facilitate such dynamic reconfiguration, it would be desirable to have a separate configuration memory interface apart from the ICAP and convention configuration interface. What follows describes in several embodiments a dynamic reconfiguration port that may be used to dynamically reconfigure a set of configuration memory cells in an integrated circuit.

Figure 2A:
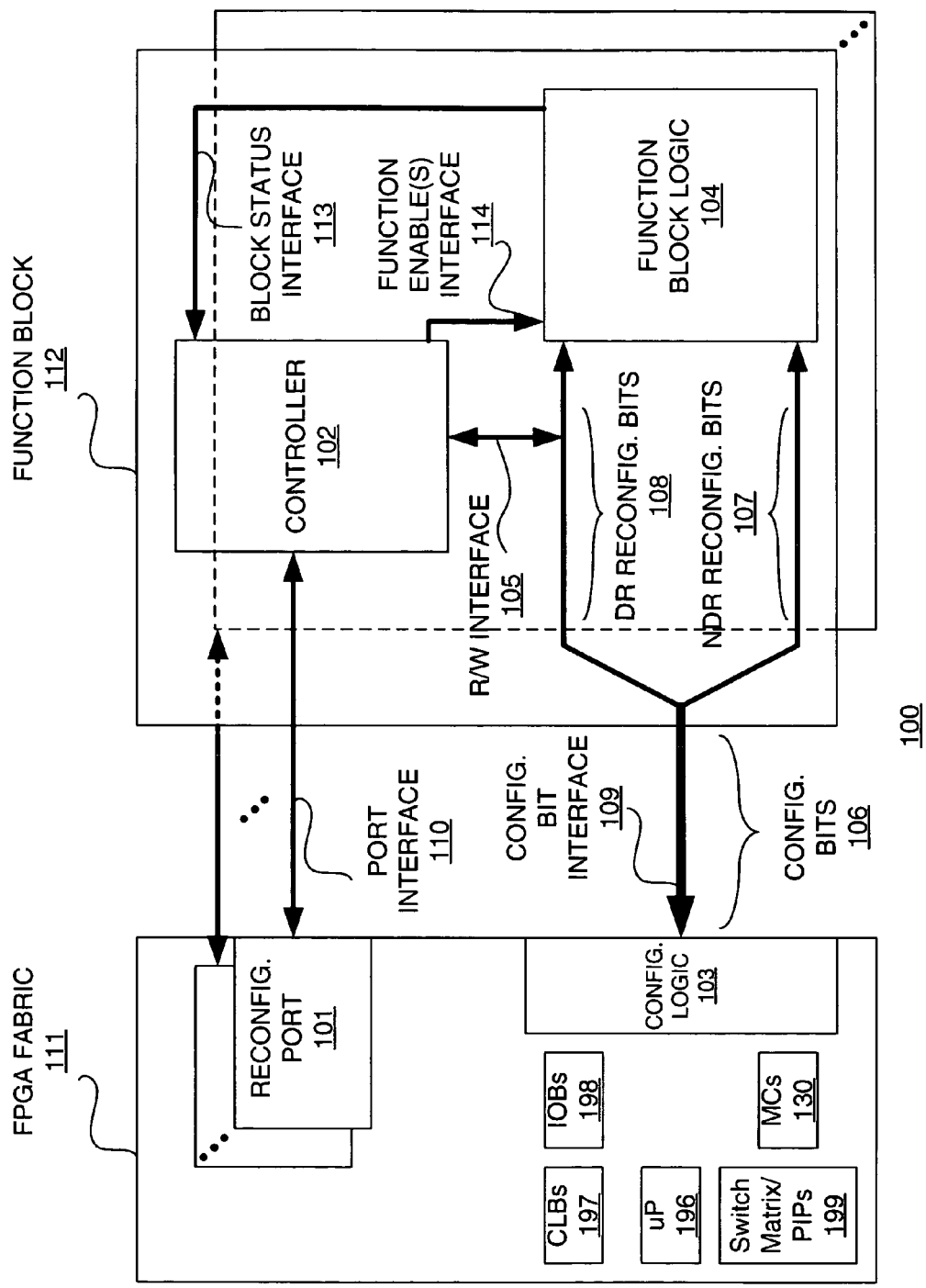
FIG. 2A is a high-level block diagram depicting an exemplary embodiment of an integrated circuit.

FIG. 2A is a high-level block diagram depicting an exemplary embodiment of an integrated circuit 100. Integrated circuit 100 may be any integrated circuit capable of reconfiguration, such as programmable logic devices, microprocessors with configurable logic, application specific integrated circuits with configurable logic, and the like. Integrated circuit 100 includes at least one dynamically reconfigurable function block. For purposes of clarity, integrated circuit 100 is described as though it were an FPGA, as it will be readily apparent from the description that follows that any integrated circuit capable of dynamic reconfiguration, as describe herein, may be used.

FPGA 100 includes an FPGA fabric 111, namely, a region where dedicated and programmable logic exists within an integrated circuit. FPGA fabric 111 includes a dynamic reconfiguration port (DRPORT), i.e., "reconfiguration" port 101.

Reconfiguration port 101 has access to one or more regions of an integrated circuit having programmable cells. Programmable cells may include volatile memory cells, non-volatile memory cells, and like programmable cells for reconfiguration. For clarity, programmable cells are described below in terms of memory cells, or configuration memory cells, although it will be apparent that other forms of circuitry for storing state may be used.

Reconfiguration port 101 provides access to and from function block 112 and to and from configuration logic 103 via a function block 112. Configuration logic 103 is for controlling configuration of configurable blocks of FPGA 100 and frame data registers, among other circuitry as is known. A configuration bitstream feeds into configuration logic 103 that drives frame data registers and other known circuitry. An ICAP (not shown) connects to configuration logic 103. Configurable blocks of FPGA 100 include, but are not limited to, one or more processors 196, CLBs 197, IOBs 198 and PIPs 199, as is known. Configurable blocks of FPGA 100 may be accessed through interconnect fabric of FPGA fabric 111. Reconfiguration port 101 connects to the interconnect fabric of FPGA fabric 111 to allow access to signals of FPGA 100. Thus, for example, a user may drive reconfiguration port 101 from a user instantiated circuit design implemented in one or more CLBs 197 externally through one or more IOBs 198, or through an embedded processor 196 or a soft processor, such as may be instantiated from CLBs 197. It should be appreciated that given sufficient space for implementing, a reconfiguration port for dynamic reconfiguration may be assigned to each function block. Thus, there are multiple function blocks 112 each having a controller 102 associated therewith for reconfiguration port 101 access, and there are multiple reconfiguration ports 101 corresponding to each controller 102. As is described below in additional detail, dynamically reconfigurable memory cells are dual ported. One of these memory ports is for dynamic reconfiguration via a reconfiguration port 101. Accordingly, each reconfiguration port 101 is associated with an address space, namely, configuration memory cells, for an associated function block 112. Though shown separately, an FPGA fabric 111 reconfiguration port 101 may be provided as an integral part of each function block 112. Accordingly, any function block 112 where dynamic reconfiguration may be advantageous may have an associated reconfiguration port. Though there are multiple function blocks 112 and associated reconfiguration ports, for purposes of clarity, a single reconfiguration port 101 associated with a single function block 112 is described, as it will be apparent that multiple reconfiguration ports 101 and function blocks 112 may be used.

Figure 2B:
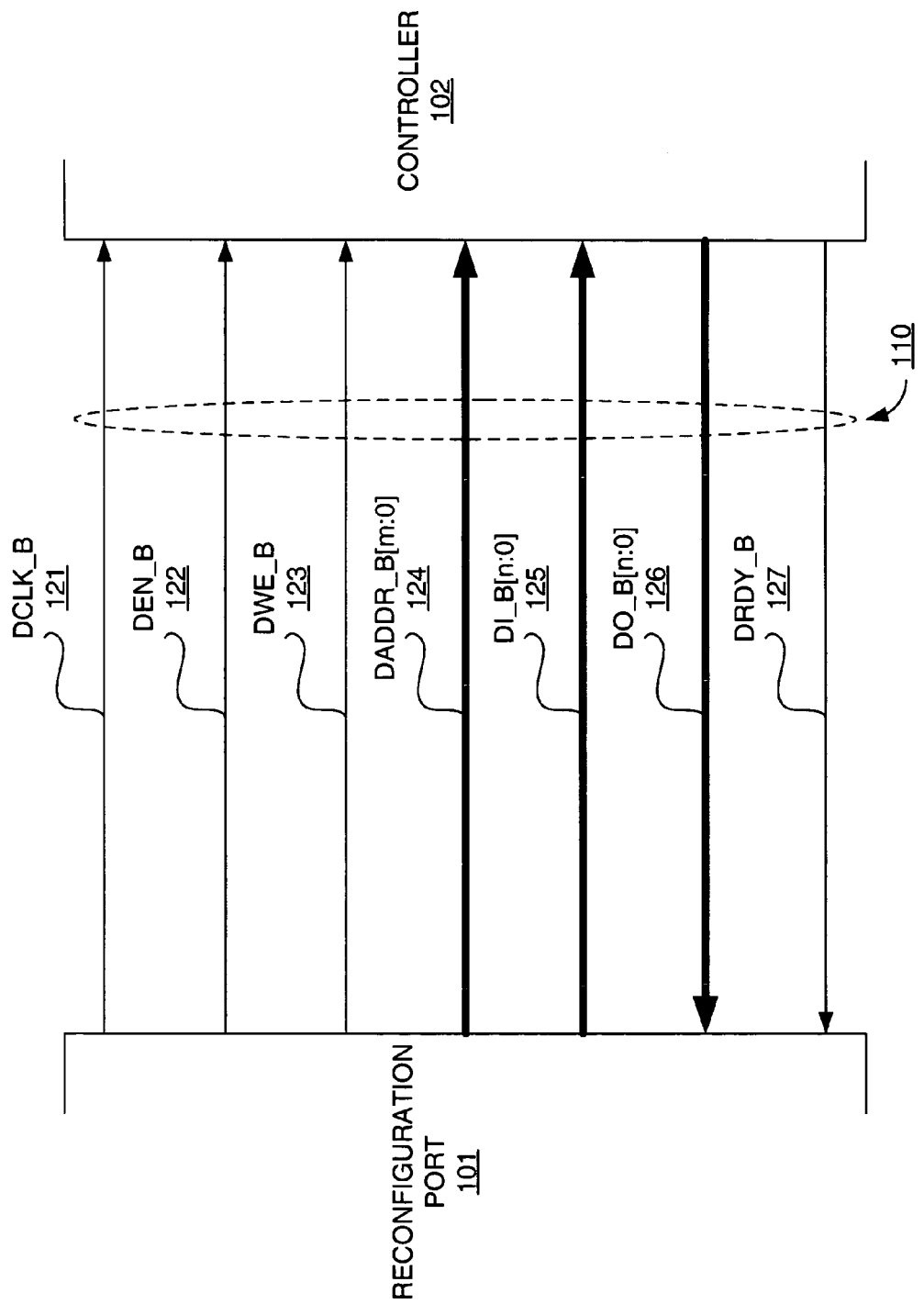
FIG. 2B is a high-level schematic diagram depicting a port interface of the FPGA of FIG. 2A.

FIG. 2B is a high-level schematic diagram depicting port interface 110 of FPGA 100. Reconfiguration port 101 is coupled to controller 102 of function block 112 via port interface 110.

Signals to and from reconfiguration port 101 and controller 102 are inverted or complemented as indicated by a "_B" to denote a "bar". Complementing may be done when connecting through an interconnect block, such as controller 102. Port interface 110 signaling from reconfiguration port 101 to controller 102 includes data clock signal 121 ("DCLK_B"), data enable signal 122 ("DEN_B"), data write enable signal 123 ("DWE_B"), data address signals 123

("DADDR_B[m:0]"), and data input signals ("DI_B[n:0]"), where "[m:0]" indicates m to 0 address lines for m an integer greater than zero and "[n:0]" indicates n to 0 data lines for n an integer greater than zero. Accordingly, addresses of length m+1 bits may be used, and data words of length n+1 bits may be used. Notably, addresses or data may be communicated serially or in parallel, though with respect to reconfiguration port 101 parallel address and data communication bussing is generally described herein. To facilitate user adoption, an interface with similar signal timing to a BRAM interface was created though implementation of reconfiguration port 101 is substantially different than a BRAM interface.

Port interface signaling from controller 102 to reconfiguration port 101 includes data output signals 126 ("DO_B[n:0]") and data ready signal 127 ("DRDY_B"). Data ready signal 127 is a handshaking signal provided to reconfiguration port 101 to indicate that controller 102 has completed or is about to complete the current operation and is ready for a next operation.

Reconfiguration port 101 is a read/write ("R/W") port, where data ready signal 127 may be used for read and write wait states. Notably, in the embodiment shown, there is no read enable signal shown. This is because in this embodiment, data output signal 126 is maintained in an active state. In another embodiment, a read enable signal may be used.

Controller 102 may further be coupled to receive other signals, such as a global write enable signal and a global restore signal, among others. Such global signals may be used for added functionality, as described below in additional detail.

Controller 102 communicates with configuration logic 103 and function block logic 104 via R/W interface 105. R/W interface 105 communicates with configuration logic 103 and function block logic 104 in part to dynamically read/write configuration/reconfiguring data bits from/to configuration memory cells, such as memory cells 131 of FIG. 2C.

For this embodiment, configuration bits may be broken out into two general types, namely, bits that are reconfigurable via reconfiguration port 101 ("dynamically reconfigurable configuration bits") and bits that are not reconfigurable via reconfiguration port 101 ("non-dynamically reconfigurable configuration bits"), where the non-dynamically reconfigurable configuration bits are reconfigured via configuration logic 103 using, for example, the ICAP or select map interface.

Configuration bit interface 109 may handle both types of configuration bits 106 though split into two sections. One of those two sections may handle only dynamically reconfigurable (DR) configuration bits 108, and thus that section or those addressable bits would be accessible by controller 102 via R/W interface 105. The other section of the two sections may handle only non-dynamically reconfigurable (NDR) bits 107, and thus would not have to be coupled to controller 102 via R/W interface 105 for communication.

More particularly, R/W interface 105 is coupled to memory cells 131, as described with reference to FIG. 2C where there is shown a high-level schematic diagram depicting controller 102 and configuration memory cells 130 of FPGA 100. R/W interface 105 provides access to memory cells 131 of memory cells 130 for reading and writing dynamically reconfigurable configuration bits 108. Thus, memory cells 130 are broken out into at least two addressable spaces, namely, memory cells 131 for storing dynamically reconfigurable configuration bits 108 and memory cells 132 for storing non-dynamically reconfigurable configuration bits 107. Notably, this may be done by providing different address ranges for storing dynamically reconfigurable and non-dynamically reconfigurable configuration bits.

Figure 2C:
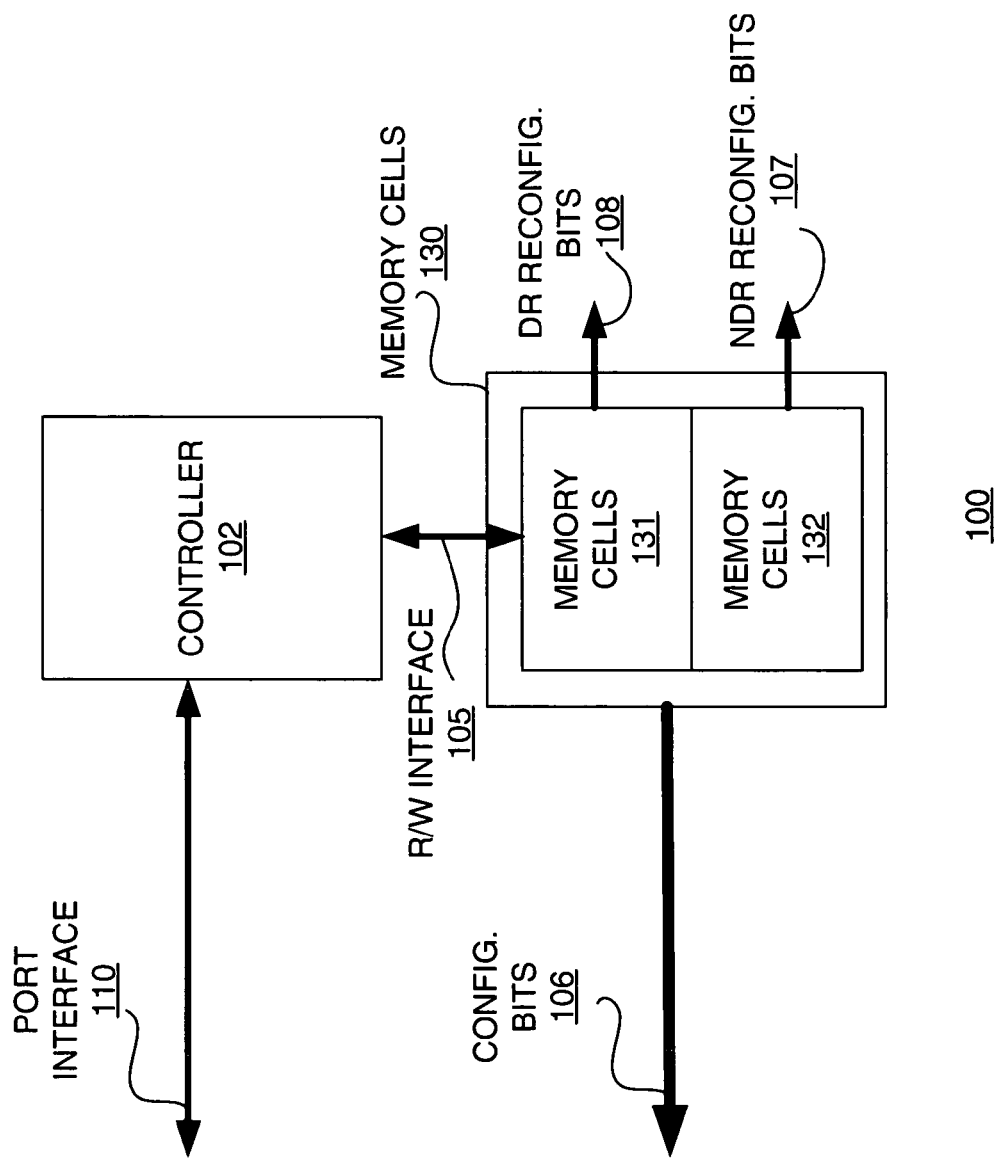
FIG. 2C where there is shown a high-level schematic diagram depicting function block of the FPGA of FIG. 2A with memory cells.

Notably, in FIGS. 2A and 2C memory cells (MC) 130 are indicated as being part of FPGA fabric 111. Thus, a portion of configuration memory cells 130 have been set aside and modified for dynamic reconfiguration via reconfiguration port 101 and another potion of configuration memory cells 130 have been not been modified for the conventional non-dynamic reconfiguration via the configuration logic 103. However, it is not required that configuration memory be used for providing dynamically reconfigurable memory cells via reconfiguration port 101. Rather, memory cells 131 may be separate memory for a function block 112. Accordingly, memory may be dedicated memory of a function block or part of general purpose memory for an integrated circuit, such as BRAMS of an FPGA.

Thus, it should be appreciated that all of memory cells 130 may be configured or reconfigured though conventional non-dynamic means. However, with respect to use of reconfiguration port 101, only a portion of memory cells 130, namely, memory cells 131, are accessible via controller 102 for dynamic reconfiguration. As mentioned above, memory cells 130 may be any of a variety of known types of memory cells operable at relatively high frequencies, and in an embodiment is equal to or in excess of approximately 500 MHz. In one embodiment, the approximately 500 MHz, for example, is a frequency of operation with no wait states (i.e., either one read or one write per data clock cycle) for use of function block 112.

For clarity by way of example, memory cells 131 are described as having SRAM memory elements, though other known types of memory elements may be used. Memory cells 131 are dual ported, where one port is for conventional non-dynamic access for configuration data and address information, and the other port is for dynamic read/write access under the control of controller 102. The term "port" as used herein includes one or more signal pins or nodes, and may refer to a particular signal pin or node.

Notably, controller 102 may be configured to access all memory elements of memory cells 131 or only a subset thereof which may depend on functionality of function block 112.

Returning to FIG. 2A, it should be appreciated that with reconfiguration port 101, reconfigurable bits may be dynamically read from or written to function block 112 for dynamic reconfiguration. In other words, each memory cell used to store a reconfigurable bit may be written to or read from dynamically. This may be done at or proximal to the frequency of operation of FPGA 100. Furthermore, because controller 102 reads and writes at data word length, such as at a single data word length, and not a frame length as was conventionally done, granularity is provided for a dynamic read-modify-write configuration or reconfiguration or both, including without limitation partial configuration or reconfiguration or both, (collectively and singly referred to hereinafter as "reconfiguration"). For example, a single memory cell may be changed within a data block by reading out only a single data word, modifying only the single memory cell of the data word read, and writing back the modified data word.

Notably, function block 112 has not been described in terms of a particular type of function, as any of a variety of functions may be used. Some examples of functions that may be used for function block 112 include without limitation a Digital Signal Processor ("DSP"), an MGT, a DCM, a CLB, an IOB, or a System Monitor. Furthermore, controller 102 may include additional functionality for one or more of such function blocks. Moreover, interconnect switch matrices and the like including one or more PIPs may be configured via a reconfiguration port 101.

For example, depending on function block logic 104, controller 102 may optionally include function enable(s) interface 114 and block status interface 113. Block status interface 113 may be a read-only port by controller 102, and function enable(s) interface 114 may be a write-only port by controller 102. Interfaces 113 and 114 may be in addition to R/W interface 105.

Block state may be read from status signaling from function block logic, and a function may be activated by providing one or more function enables to function block logic 104. Block status signaling and function enable signaling may be accessed from reconfiguration port 101 via controller 102 by addressing.

For example, address space may be broken out into distinct groups for addressable memory and addressable signals. Responsive to receiving an address within an address space assigned to addressable memory, such as via data address signal 124, controller 102 accesses R/W interface 105 to write to or read from a memory element of a memory cell, or respective memory elements of memory cells. Responsive to receiving an address within an address space assigned to a signals/functions (including without limitation a block status request) controller 102 writes a function enable via interface 113 into the block or read status output. This disables reading/writing from one or more memory cells, and causes status signaling to be read back via interface 114 or causes function enables to be written into registers or other blocks in function block 104. Notably, by increasing internal address space, functions, including without limitation test functions, may be initiated with controller 102 and status read out, including without limitation test results, using reconfiguration port 101 without the expense of dedicated function and read out ports.

Figure 3A:
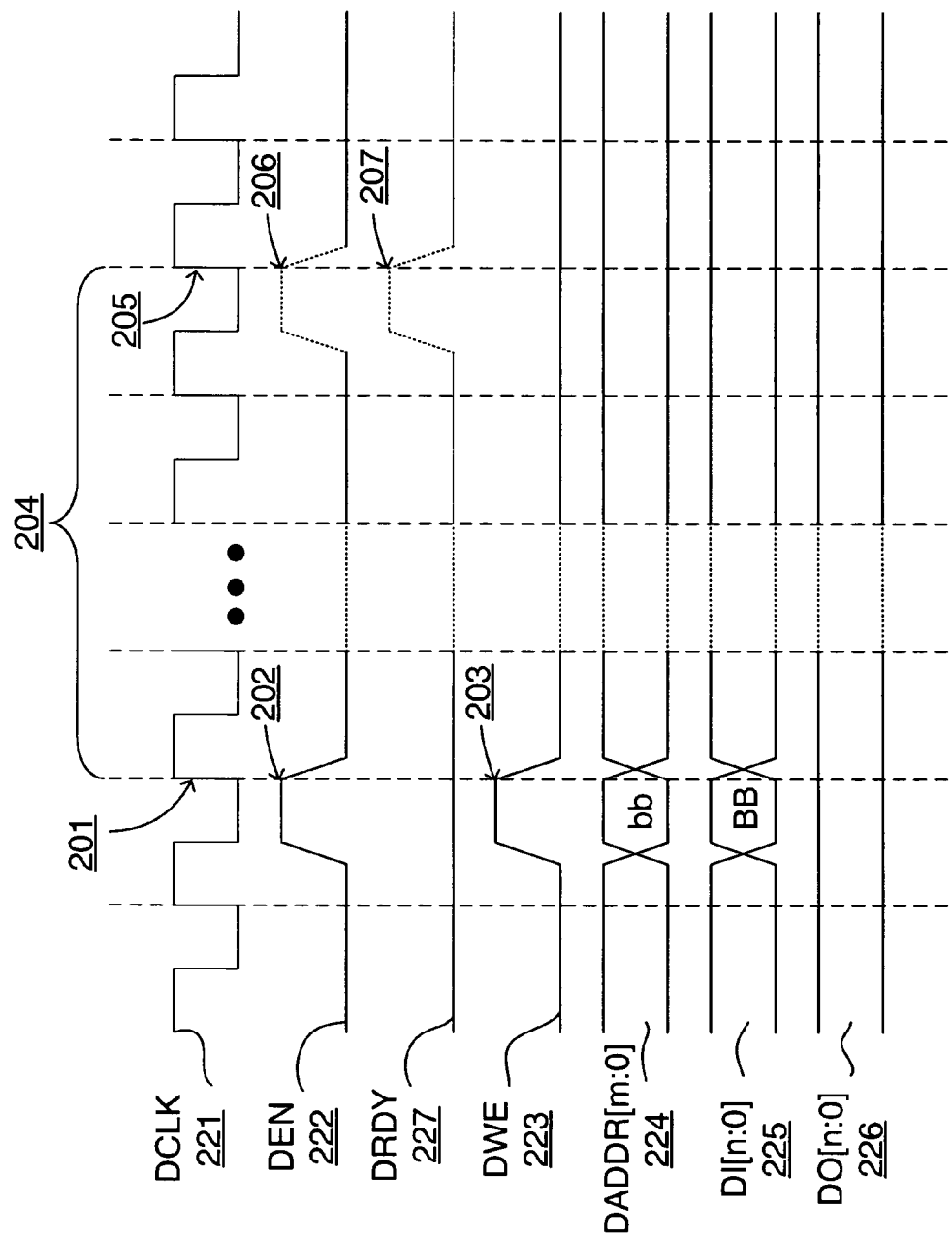
FIG. 3A is a signal diagram depicting an exemplary embodiment of write signaling between a reconfiguration port and a reconfiguration controller.

FIG. 3A is a signal diagram depicting an exemplary embodiment of write signaling between reconfiguration port 101 and controller 102. For clarity, the signals of FIG. 3A correspond to non-inverted versions of the signals of FIG. 2B. In the exemplary embodiment shown, signals are active on a rising edges, such as edge 201 of data clock signal 221; however, alternatively signals may be triggered on falling edges or on both rising and falling edges.

On rising edge 201, data enable signal 222 at 202 and data write enable signal 223 at 203 are both active high causing both data address signal 224 and data input signal 225 to be sampled (e.g., "bb" and "BB", respectively) at approximately the same time. Controller 102 of FIG. 2A decodes the sampled address from data address signal 224 and writes the sampled data from data input signal 225 to memory elements associated with the decoded address. Notably, there is a wait state 204 between rising edges 201 and 205 of data clock signal 221. At rising edge 205, data ready signal 227 is active high at 207 to indicate a next operation may begin. Data enable signal 222 may go active high again at 206 after data ready signal 227 goes active high, which may occur on the same clock cycle (as shown) or the next clock cycle of data clock signal 221. Notably, because writing to a memory element is signal driven, wait state 204 may take less time than a read wait state. In an embodiment, a write takes place within a clock cycle of data clock 221. In general, a write may take T clock cycles and a read may take P clock cycles, where T is less than P. For example, a T may be equal to one and P may be equal to two. In an embodiment, a design instantiated in programmable fabric, such as with one or more CLBs, may communicate with controller 102 ignoring data ready signal 127 for write operations and waiting for data ready signal 127 for read operations. Such a design may be instantiated any of a variety of ways, including, but not limited to, user instantiation and FPGA instantiation. When instantiated by FPGA 100, such instantiation may be done by an internal processor executing instructions. For processor instantiation, data ready signal 127 may or may not be used as a handshaking signal.

Figure 3B:
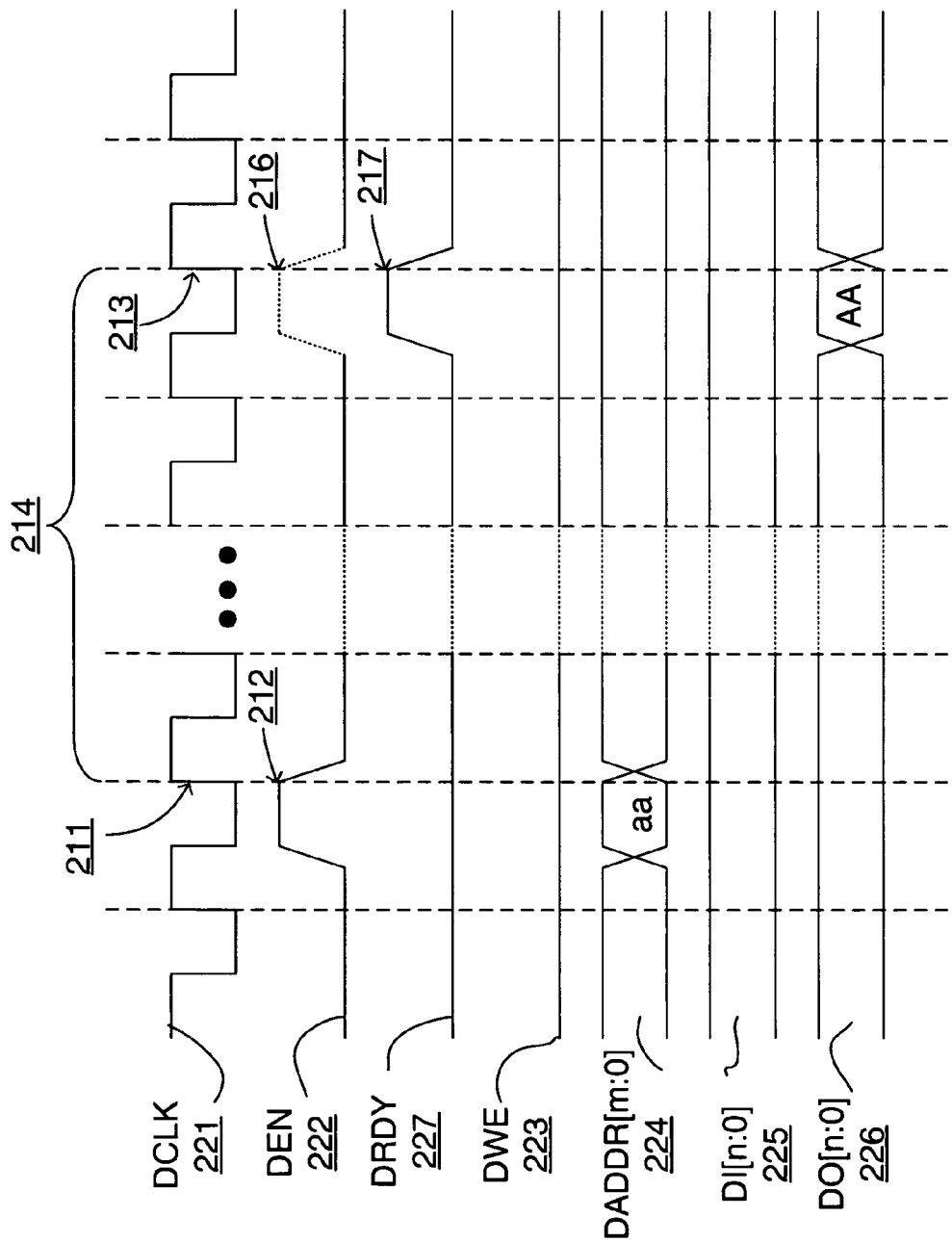
FIG. 3B is a signal diagram depicting an exemplary embodiment of read signaling between a reconfiguration port and a reconfiguration controller.

FIG. 3B is a signal diagram depicting an exemplary embodiment of read signaling between reconfiguration port 101 and controller 102. In the exemplary embodiment shown, signals are active on rising edges, such as edge 211 of data clock signal 221; however, alternatively signals may be triggered on falling edges or on both rising and falling edges.

On rising edge 211, data enable signal 222 at 212 is active high causing data address signal 224 to be sampled (e.g., "aa"). Controller 102 of FIG. 2A decodes the sampled address from data address signal 224 and reads configuration data from memory elements associated with the decoded address. Notably, there is a wait state 214 between rising edges 211 and 215 of data clock signal 221. At rising edge 215, data ready signal 227 is active high at 217 to indicate a next operation may begin, and for this timing, to indicate that data output signal 225 may be sampled responsive to data enable signal 222. Data enable signal 222 may go active high again at 216 after data ready signal 227 goes active high, which may occur on the same clock cycle (as shown) or the next clock cycle of data clock signal 221 to cause data output signal 226 to be sampled (e.g., "AA"). Notably, data ready signal 227 may be pipelined with data enable signal 222, as described below in additional detail.

With continuing reference to FIG. 3B and renewed reference to FIG. 2C, in an embodiment memory cells 131 may be substantially smaller in number than memory cells 132. With fewer memory cells to fabricate for dual ported access, transistors of memory elements of memory cells 131 may be sized larger than transistors of memory elements of memory cells 132. Larger transistors facilitate faster reads of memory elements and thus reduce wait state 214.

Figure 4A:
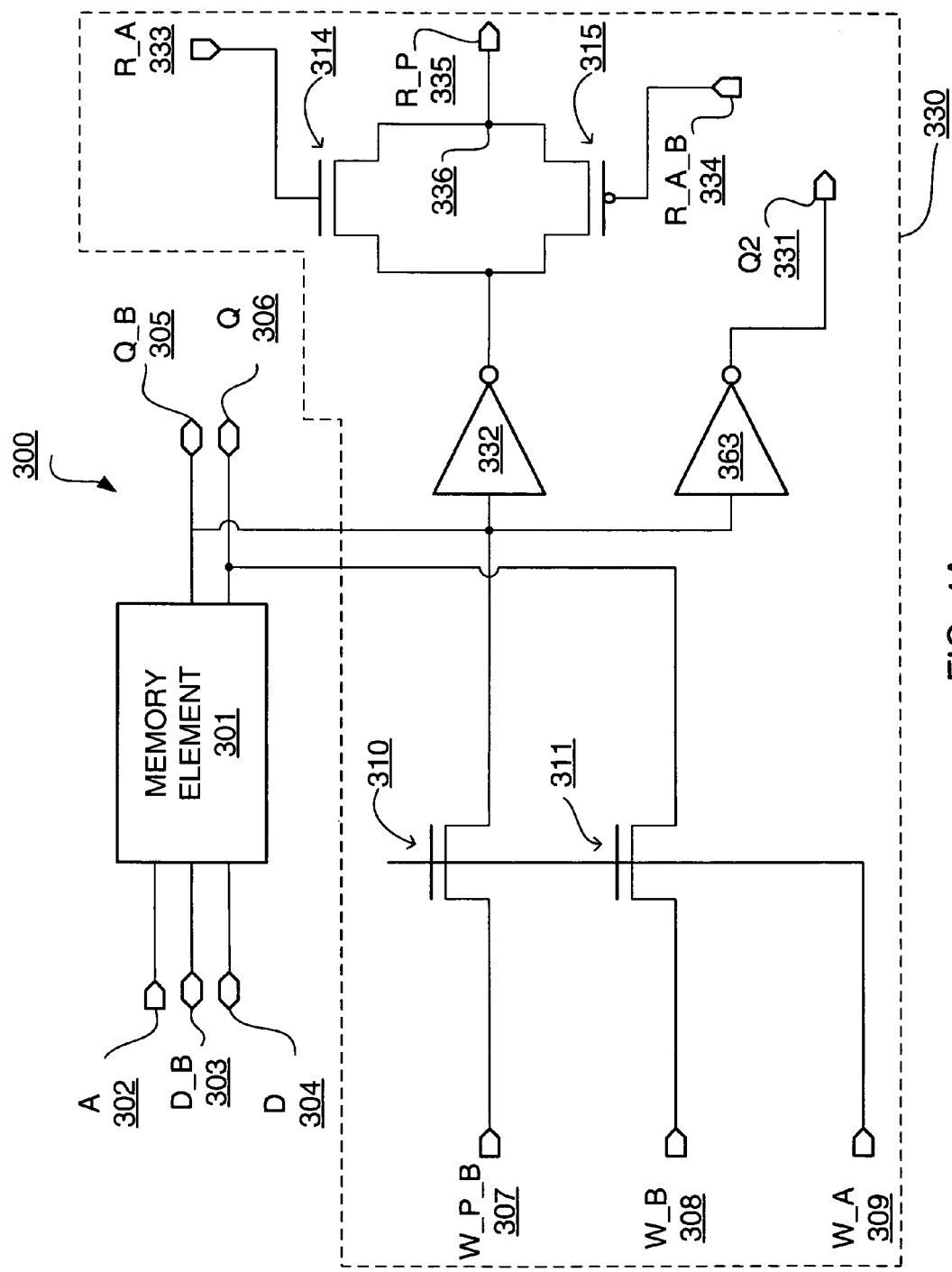
FIG. 4A is a schematic diagram depicting an exemplary embodiment of a dual ported memory cell.

FIG. 4A is a schematic diagram depicting an exemplary embodiment of a dual ported memory cell 300. Memory cells 131 of FIG. 2C may include dual ported memory cells 300. While dual ported memory cell 300 may store any configuration bit of data, dual ported memory cell 300 is describe below as storing a dynamically reconfigurable configuration bit of data for function block 112 of FIG. 2A.

Dual ported memory cell 300 includes storage element 301 for storage of a dynamically reconfigurable configuration bit. Notably, storage element 301 may be a memory storage element, a volatile or non-volatile storage elementor any other element capable of storing a bit state. For purposes of clarity, a memory storage element is described herein.

Figure 4B:
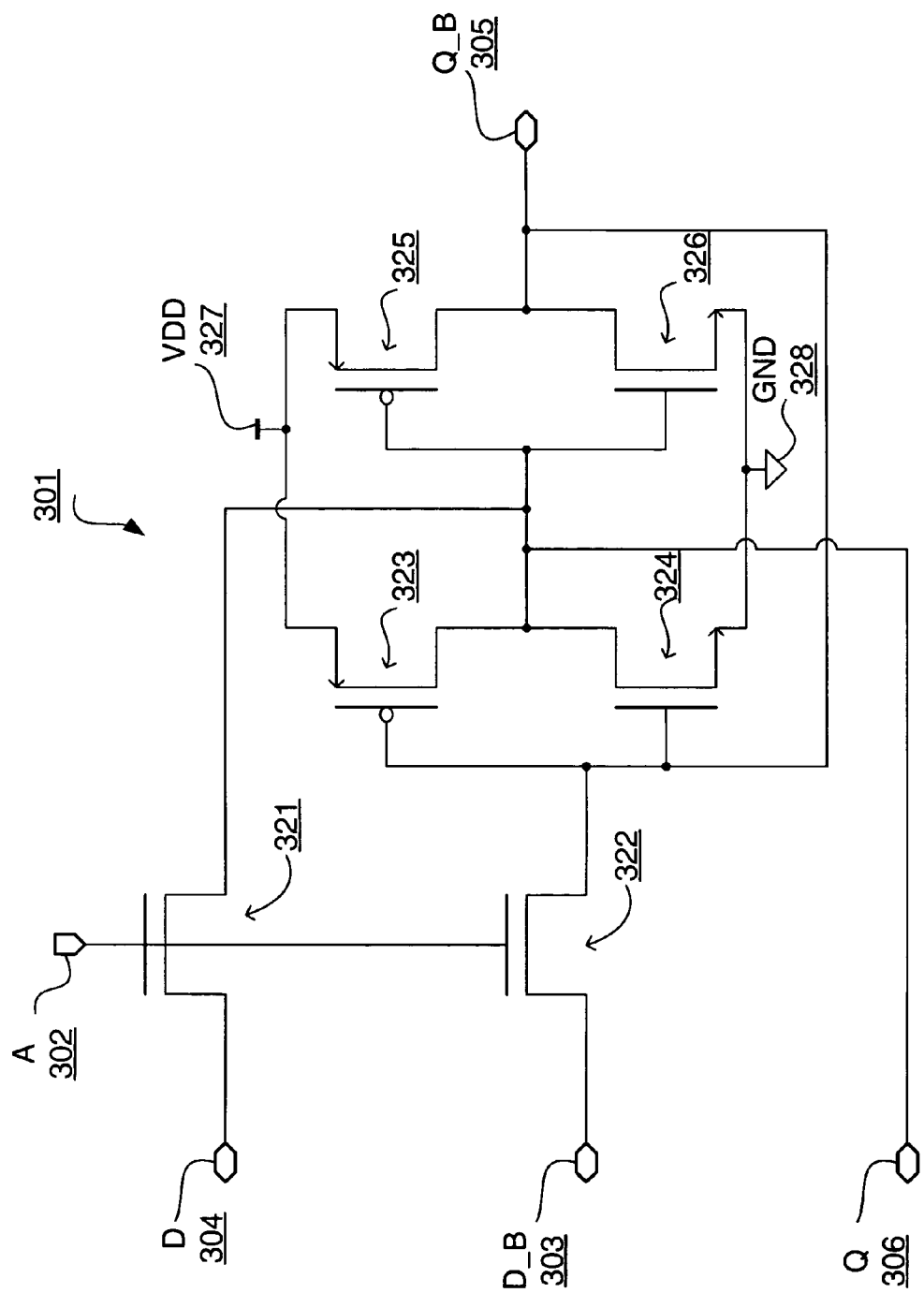
FIG. 4B is a schematic diagram depicting an exemplary embodiment of memory element.

FIG. 4B is a schematic diagram depicting an exemplary embodiment of memory element 301. Structure of memory element 301 is a well-known 6T SRAM cell; however, signaling within the context of reconfiguration as described herein is new. With continuing reference to FIG. 4B and renewed reference to FIG. 4A, dual ported memory cell 300 is further described.

Data signal ("D") 304 is connected to a source terminal of pass transistor 321. An inverted version of data signal 304, namely, data signal ("D_B") 303, is connected to a source terminal of pass transistor 322. Drain terminals of transistors 321 and 322 are respectively conventionally coupled to a cross-coupled latch of a conventional SRAM memory element. An address signal ("A") 302 is applied to gates of pass transistors 321 and 322 for selectively coupling data signal 304 to an input of an inverter formed by p-type transistor 325 and n-type transistor 326, and for selectively coupling data signal 303 to an inverter formed by p-type transistor 323 and n-type transistor 324. These inverters are cross-coupled to form a latch. Sources of transistors 323 and 325 are coupled to a supply voltage, such as VDD 327, and sources of transistors 324 and 326 are coupled to a ground potential, such as ground 328. Output from the inverter formed of transistors 323 and 324 is output signal ("Q") 306. Output from the inverter formed of transistors 325 and 326 is output signal ("Q_B") 305.

It should be understood that ports for data signals 303 and 304 and output signals 305 and 306 are bi-directional, namely, they are input/output ports. Furthermore, it should be understood that pass transistors 321 and 322 provide one port of dual ported memory cell 300, and the other port is provided via pass transistors 310 and 311. As memory element 301 is conventional, further description is omitted for purposes of clarity. R/W interface 105 of FIG. 2A may be coupled to the other port of dual port memory cell 300, namely, reconfiguration memory cell port 330.

For access via reconfiguration memory cell port 330 for a write operation, a write address signal ("W_A") 309 is provided to each gate of pass transistors 310 and 311. A source terminal of pass transistor 310 sources an inverted write port signal ("W_P_B") 307, and a source terminal of pass transistor 311 sources a write port signal ("W_P") 308. Drain terminals of pass transistors 310 and 311 are respectively coupled to signal paths of output signals 305 and 306 for input to memory element 301.

Responsive to write address signal 309 being at a high logic level, transistor 310 couples inverted write port signal 307 to inverted output signal 305 as an input to memory element 301, and transistor 311 couples write port signal 307 to inverted output signal 305 as an input to memory element 301 for writing any data on write port signals 307 and 308 to memory element 301. Thus, responsive to write address signal 309 being asserted, write port signals 307, 308 cause a dynamically reconfigurable configuration bit to be written to memory element 301.

During a read operation via reconfiguration memory cell port 330, write address signal 309 is at a low logic level. A state stored in a latch of memory cell 301 is output via output signal paths for output signal 305, 306. By connecting to one of these paths, data may be read from memory element 301.

Data read from memory element 301 for one of the ports is sourced from output signal 306 and for reconfiguration memory cell port 330 is sourced from output signal 305. Output from output signal 305 is provided as an input to inverter 332, and output from inverter 332 is provided as an input to select transistors 314 and 315. Output from output signal 305 may optionally be provided as an input to inverter 363, where output from inverter 363 is additional output signal, namely, output signal ("Q2") 331.

Because memory element 301 is continuously read, except during a write operation, select circuitry, such as with n-type transistor 314 and p-type transistor 315 coupled in parallel, may be used to controllably select when data is to be readout as read port signal ("R_P") 335. Notably, other select circuits may be used, such as a single pass transistor coupled in series with inverter 332 to provide read port signal ("R_P") 335, among other known types of select circuits.

Transistors 314 and 315 are sourced with the output from inverter 332, and transistors 314 and 315 have their drains commonly connected to a read port node 336. Transistor 314 is gated with read address signal ("R_A") 333, and transistor 315 is gated with an inverted version of read address signal 333, namely, inverted read address signal ("R_A_B") 334. Responsive to read address signal 333 being at a high logic level and read address signal 334 being at a low logic level, both of transistors 314 and 315 conduct output of inverter 332 to read port node 336 to provide read port signal 335. Responsive to read address signal 333 being at a low logic level and read address signal 334 being at a high logic level, both of transistors 314 and 315 do not conduct output of inverter 332 to read port node 336.

Notably, read port signal 336 may be provided to a multiplexer, and write address 309 and read address 334 may be obtained from a decoder.

Moreover, it may be desirable to do a chip-wide check of memory cells used for non-dynamically reconfigurable bits for an inadvertent change of state, such as may be caused by a Single Event Upset ("SEU") due to subatomic particles. However, memory cells used for dynamically reconfigurable configuration bits may be masked from such an SEU check, as dynamically reconfigurable configuration bits may frequently be intentionally changed. However, a user may desire to opt out of dynamic reconfiguration, in which event it may be desirable to be able to selectively enable and disable masking for SEU checking of memory cells allocated for dynamic reconfiguration. Furthermore, within a frame, a user may desire to frequently change only a fraction of the bits of the frame, in which event it may be desirable to be able to selectively enable masking out SEU checking for those bits to be frequently changed in blocks of memory cells, while allowing SEU checking for the remainder of the bits of in the frame. Masking of dynamically reconfigurable configuration bits is described below in additional detail.

Though write and read ports of memory cell 300 were described in terms of storing a dynamically reconfigurable configuration bit, as mentioned above write-only and read-only ports may be provided for function enable(s) and block status, respectively. Thus, a portion of addressable memory cells 300 may be reserved as dynamically reconfigurable memory cells, and another portion of addressable memory cells 300 may be reserved to provide write-only and read-only ports by connecting write and read ports of such memory cells 300, not to memory elements 301, but to status registers.

FIG. 5A is a block diagram depicting an exemplary embodiment of a memory cell frame architecture 400.

Memory cell frame architecture 400 includes upper frame configuration bit section 401 and lower frame configuration bit section 402. Disposed between upper and lower frame sections 401 and 402 is a block of memory cells 404 for routing global signals with respect to frame 400, which may for example be used for masking, as described in additional detail in a co-pending patent application entitled "DATA MONITORING FOR SINGLE EVENT UPSET IN A PROGRAMMABLE LOGIC DEVICE" by Martin L. Voogel, et al., filed Mar. 22, 2004, which is incorporated by reference herein in its entirety.

Upper and lower frame sections 401 and 402 each include N blocks 403 of configuration memory cells, such as dual ported memory cells 300 of FIG. 4A, for N a positive integer. Notably, multiple blocks 403 may be connected together with interconnect tiles, such as configuration bit interface 109 of FIG. 2A. For example, four blocks of memory cells 403 of twenty memory cells each may be connected together to provide a pitch of 80 memory cells for each CLB.

FIG. 5B is a block diagram depicting an exemplary of a block of memory cells ("block") 403. Any of a variety of numbers and combinations thereof of configuration memory cells may be used; however, to provide clarity though example, suppose a frame is 1296 bits, then frame 400 of FIG. 5A includes at least 1296 memory cells. Of these, 1280 memory cells are divided into blocks of 20 memory cells each for 64 super blocks of memory cells. Of these 64 super blocks of memory cells, 32 each may be located above and below a block of 16 memory cells, such as block 404 of FIG. 5A.

For a block 403 having 20 memory cells, 16 memory cells 413 may be used for storing dynamically reconfigurable configuration bits. To provide address separation or granularity, memory cells 410-1 and 410-2 have their address line electrically open ("broken") for address signal 302 and are partially unconnected or disconnected from memory cells 413. Memory cell 412 may be used to store a masking bit, and memory cell 411 may be left unused. Masking circuitry for a masking bit is described in additional detail in above-mentioned co-pending patent application entitled "DATA MONITORING FOR SINGLE EVENT UPSET IN A PROGRAMMABLE LOGIC DEVICE" by Martin L. Voogel, et al., which was incorporated by reference herein in its entirety. A masking bit may be used herein to prevent SEU checking of one or more memory cells in a block that stores dynamically reconfigurable configuration bit information. In the above-incorporated reference, 12 memory cells of 16 memory cells of block 404 are reserved to provide a checksum or like check for SEU checking. Thus, the remaining 4 memory cells may be used for another purpose like the remainder of block 403.

It should be understood that memory cells of frame 400 are configuration memory cells for configuring logic, a portion of which may be reserved for dynamically reconfigurable configuration bits for interaction with function block logic 104 of FIG. 2A. However, this was done merely to reduce adding circuitry to FPGA 100. Alternatively, for an integrated circuit 100, including without limitation an FPGA, a portion of any embedded memory, for example a main memory cell array, may be used with shadow registers to copy memory cell values for dynamically reconfigurable configuration bits.

Masking bits are applied locally to a group of memory cells, such as memory cells 413 of block 403, but may depend in part upon application of the block. Accordingly, for example, masking may be done with a 16-bit granularity. Notably, masking may be at a higher level (e.g., at a frame level) instead of locally at a block level, or done at a level between a block level and a frame level depending on application.

Because memory cells, such as memory cells 300 of FIG. 4A, are written to and read from in blocks of M+1 memory cells, for M+1 a positive integer, memory cells may be grouped according to functionality. In other words, sets of memory cells may be grouped based on similar functionality for function logic block 104 of FIG. 2A, as these memory cells within the same block 403 have the same write address signal 309 and read address signal 333. Dynamically reconfigurable bits are accessed in blocks via R/W interface 105. Conventional configuration bit addressing, though done on a frame basis, uses address signal 302 and data signals 303 and 304 of FIG. 4A for ports.

Again though configuration memory cells have been described in terms of an FPGA, it should be appreciated that other types of integrated circuits may be used as previously mentioned, and that cells, other than memory cells, may be used as previously mentioned and such cells may be connected to signals instead of memory elements. Moreover, though a block of 16 memory cells was described for storing dynamically reconfigurable configuration bits, it should be understood that fewer or more than 16 bits may be address separated. For example, as few as one bit may be address separated, or as many as all bits in a frame may be combined. However, with respect to providing a fine granularity for accessing one or more dynamically reconfigurable configuration bits, it should be appreciated that reconfiguration is limited to the isolated bit or bits, and not adjacent bits. With such granularity, such isolated bit or bits need not be reset during reconfiguration, though they may be reset. Moreover, with such granularity, one or only a relatively small number of bits as compared to an entire frame of bits may be changed during dynamic reconfiguration, which facilitates changing functionality while a function block is still operational. In other words, memory cells in an FPGA may be coded into software attributes for users using FPGA manufacturer provided software, for example which have heretofore generally been thought of as hard coded, approach the flexibility of off-chip input signals.

Figure 6:
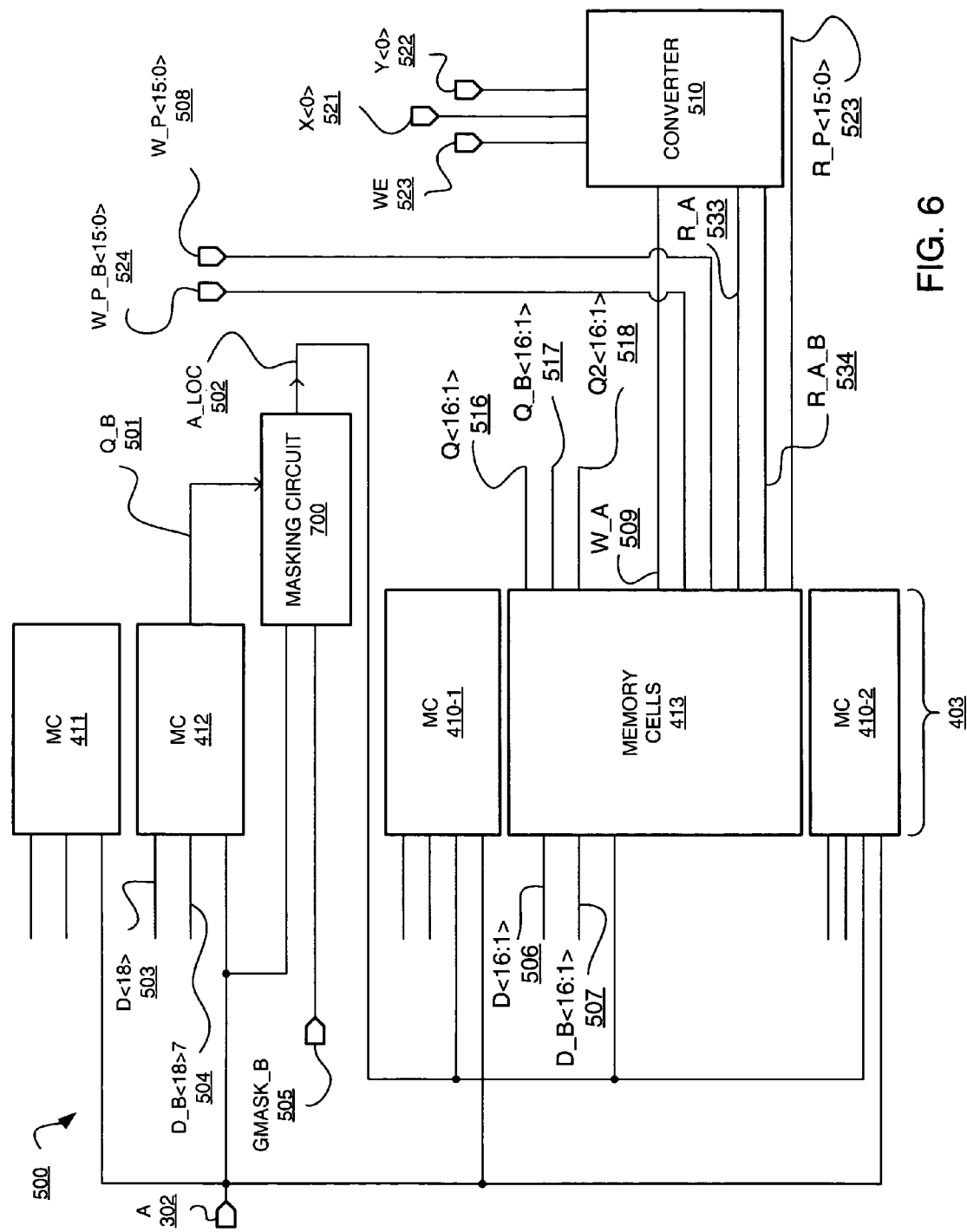
FIG. 6 is a block diagram depicting an exemplary embodiment of memory cells connected to a coordinate-to-address converter.

Referring to FIG. 6, there is shown a block diagram of memory cells 413 connected to a coordinate-to-address converter 510. Notably, memory cells 411, though not used, and memory cells 410-1 and 410-2, may be coupled to receive data signals and their complements, in addition to address signal 302, for bits, such as bit numbers 19, 17 and 0, respectively, though not shown for purposes of clarity as those cells are not used or accessible, as previously described.

Memory cells 410-1, 410-2 are coupled to receive address signal 302 as a address signal input. Address local signal 502 from masking circuit 700 is provided to memory cells 410-1, 410-2 and memory cells 413 as an address signal. Address signal 302 is provided to memory cells 411 and 412 as an address signal.

Memory cell 412 is coupled to receive data signal 503 and its complement data signal 504 for bit 18 ("D<18>" and "D_B<18>") of block 403. Memory cells 413 are coupled to receive, in parallel though not specifically shown with separate lines for purposes of clarity, data signals 506 ("D<16:1>") and their respective complemented data signals 507 ("D_B<16:1>"). Data signals 503 and 506 are related to data signal 304 of FIG. 4B, and data signals 504 and 507 are related to data signal 303 of FIG. 4B.

Output signals ("Q<16:1>") 516 and their respective complemented output signals ("Q_B<16:1>") 517 are respectively related to output signals 306 and 305 of FIG. 4A. Optional output signals ("Q2<16:1>") 518 are related to optional output signal 331 of FIG. 4A. Write address signals 509 are related to write address signal 309 of FIG. 4A. Write port signals ("W_P<15:0>") 508 and their respective complemented write port signals ("W_P_B<15:0>") 524 are respectively related to write port signals 308 and 307 of FIG. 4A. Read address signal ("R_A") 533 and complemented read address signal ("R_A_B") 534 are respectively related to read address signal 333 and read address signal 334 of FIG. 4A. Read port signal ("R_P<15:0>") 535 is related to read port signal 335 of FIG. 4A.

Write address signal 509 and read address signals 533, 534 are provided from coordinate-to-address converter 510 to memory cells 413. Coordinate-to-address converter 510 may be considered part of or separate from controller 102 of FIG. 2B. Coordinate-to-address converter 510 decodes address signal 509 from data address signal 124 of FIG. 2B. Coordinate signals, namely X<0> signal 521 and Y<0> signal 522, are a form of a data address signal for obtaining (x,y) coordinates of a memory array and are provided to coordinate-to-address converter 510. Notably, a zero for coordinate signals 521, 522 is shown for addressing a memory cell of memory cells 413. However, it should be appreciated that for the above example of a 1296 bit frame with 16-bit blocks, other bit values for coordinate signals 521, 522 will be present. For example coordinate signals 521 and 522 may be more generally expressed as X<7:0> and Y<7:0>. Furthermore, it should be understood that other numerical addressing schemes may be used. Additionally, it should be understood that with one unique Y address in a columnar architecture, X address are automatically rotated in a vertical address stack.

Write enable signal ("WE") 523 is provided to coordinate-to-address converter 510. Responsive to write enable signal 523 being at a logic low level, coordinate signals 521, 522 are for read addressing. Responsive to write enable signal 523 being at a logic high level, coordinate signals 521, 522 are for write addressing.

Masking circuit 700 receives address signal 302, complemented output signal 501 and a complemented global masking signal ("GMASK_B") 505, and responsive to such inputs provides address location signal 502.

Figure 7:
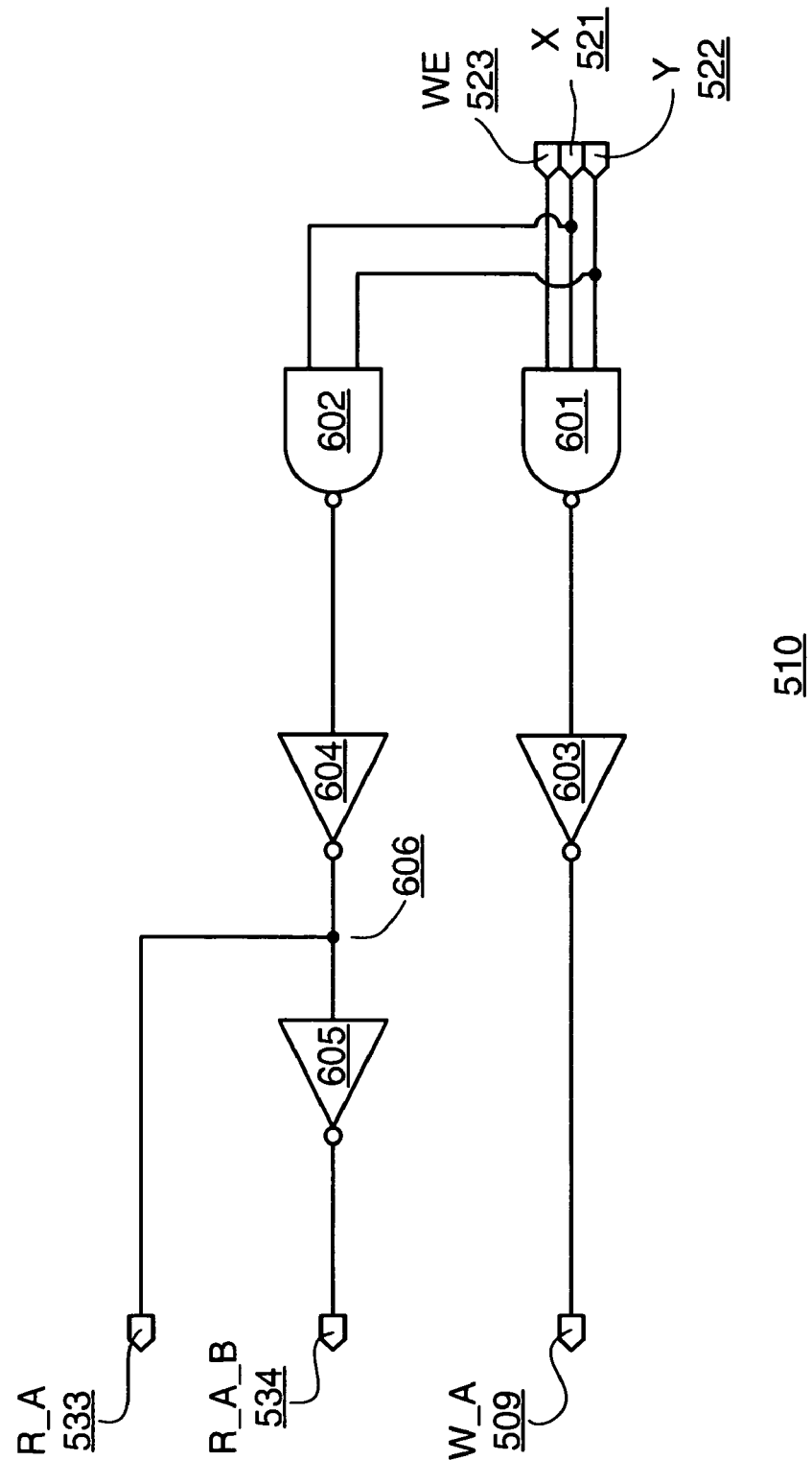
FIG. 7 is a schematic diagram depicting an exemplary embodiment of the coordinate-to-address converter of FIG. 6.

FIG. 7 is a schematic diagram of an exemplary embodiment of coordinate-to-address converter 510. Notably, combinational logic, other than that shown in this example, may be used for coordinate-to-address converter 510. Write enable signal 523 is provided to NAND gate 601, along with X coordinate signal 521 and Y coordinate signal 522. Notably, no bit indication is provided for X and Y coordinate signals 521 and 522 to indicate that coordinate-to-address converter 510 is distributed, meaning that there is converter 510 for each (x,y) pair of coordinates. Collectively, all converters 510 receive input from a R/W decoder 900 of FIG. 10 or are part of a distributed R/W decoder 900 of FIG. 10.

Figure 10:
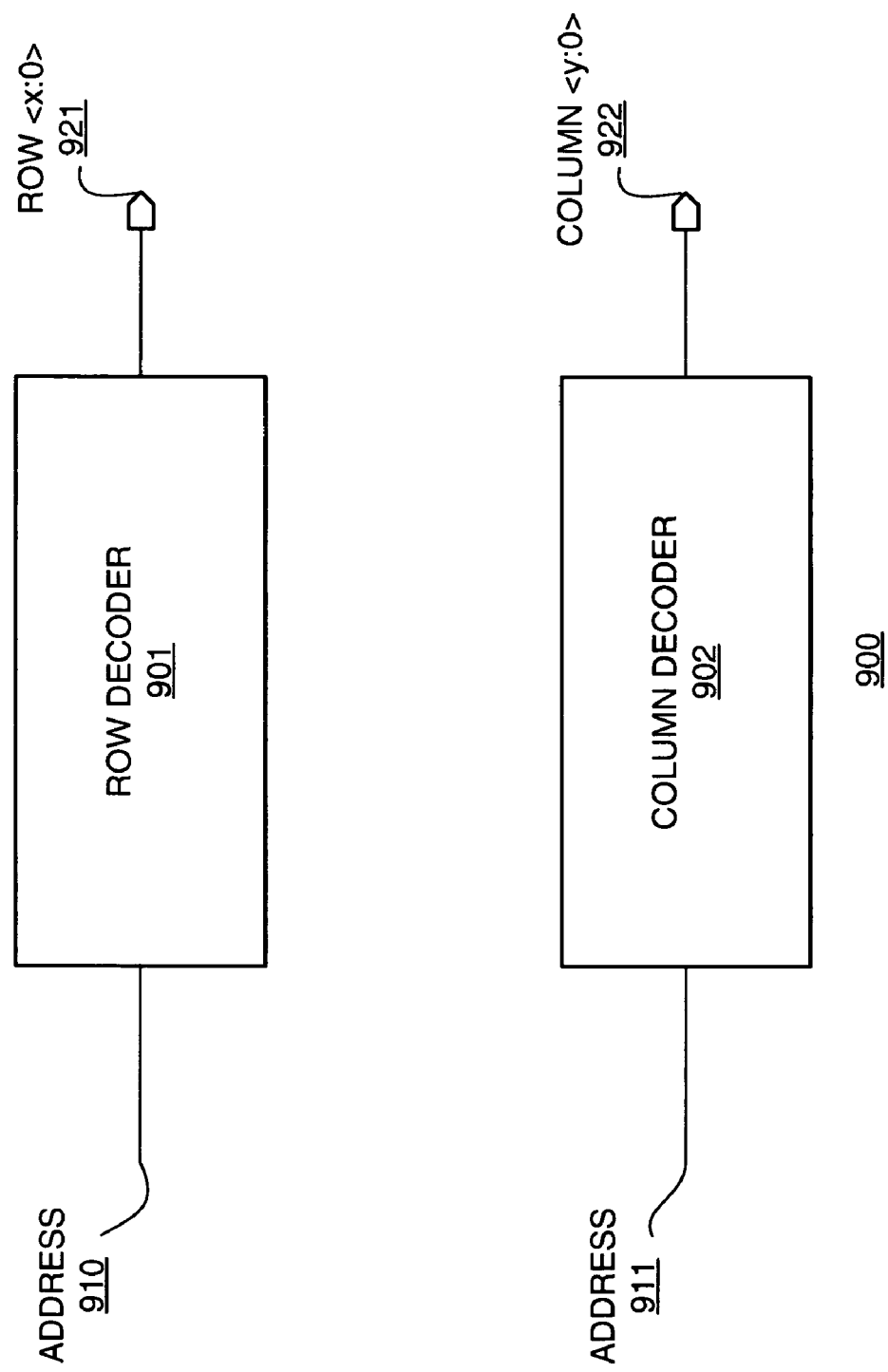
FIG. 10 is a block diagram depicting an exemplary embodiment of a decoder.

FIG. 10 is a block diagram depicting an exemplary embodiment of a decoder 900. Data address signal 910, which may be a pipelined portion of data address signal 224 of FIG. 3A, is provided to row decoder 901. Decoded output of row decoder 901 responsive to data address signal 910 is row signal 921. Row signal 921 may be an x<i:0> bit signal related to X coordinate signal 521 of FIG. 6, for i an integer. Data address signal 911, which may be a pipelined portion of data address signal 224 of FIG. 3A, is provided to column decoder 902. Decoded output of column decoder 902 responsive to data address signal 911 is column signal 922. Column signal 922 may be a y<j:0> bit signal related to Y coordinate signal 522 of FIG. 6, for j an integer.

Notably, data address signals 910 and 911 may form data address signal 224 of FIG. 3A. For example, if data address signal 224 of FIG. 3A has a bit width of 6, then data address signal 910 may be bits 0 to 2 and data address signal 911 may be bits 3 to 5. Notably, other bit widths may be used, though for purposes of clarity by way of example, a bit width of 2^3(8) bits for x and y coordinates is assumed where x and y are decoded from 3 bits each of data address signal 224. A seventh bit of data address signal divides address space between memory cells and status/function enables.

Returning to FIG. 7, output of NAND gate 601 is connected to the input of inverter 602. Thus, responsive to write enable signal 523 being logic high, write address signal 509 obtained from the output of inverter 603 is logic high, and responsive to write enable signal 523 being logic low, write address signal 509 is logic low.

Coordinate signals 521, 522 are provided to NAND gate 602. The output of NAND gate 602 is coupled to inverter 605 via inverter 604. Inverters 604 and 605 are connected in series. The output of inverter 604 is tapped at node 606 to obtain read address signal 533, and the output of inverter 605 provides inverted read address signal 534.

Figure 8:
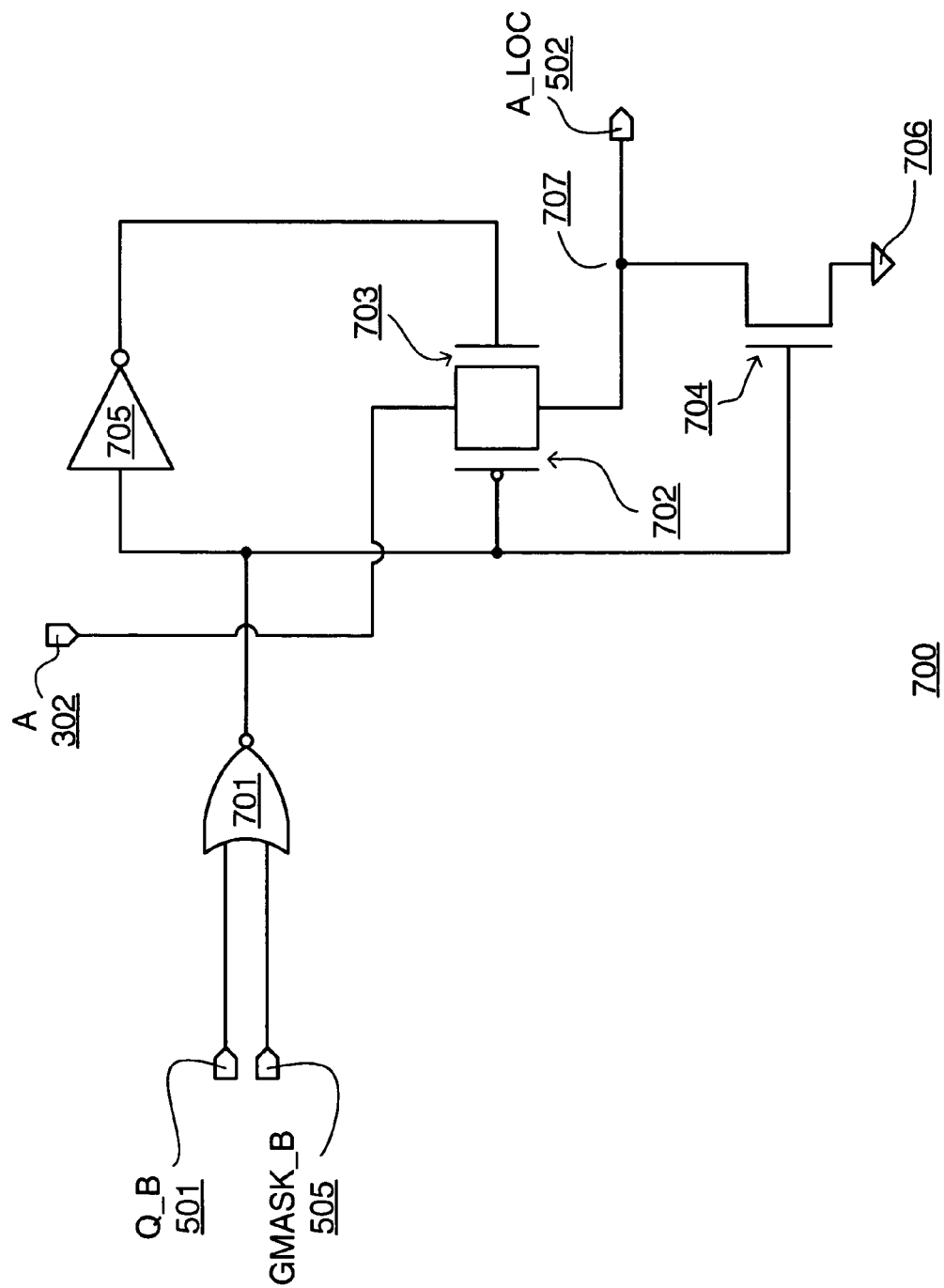
FIG. 8 is a schematic diagram depicting an exemplary embodiment of a masking circuit.

FIG. 8 is a schematic diagram of an exemplary embodiment of masking circuit 700. Output signal 501 and complemented global masking signal 505 are inputs to NOR gate 701. Output from NOR gate 701 is provided to a gate of p-type transistor 702 and a gate of n-type transistor 704 and to an input of inverter 705. Address signal 302 is provided to a common node of a source of n-type transistor 703 and a source of p-type transistor 702. Output of inverter 705 is provided as an input to a gate of n-type transistor 703. Output of drains of n-type transistor 703 and p-type transistor 702 are connected at a common node 707, which is connected to a source of n-type transistor 704, where the drain of n-type transistor 704 is connected to ground 706. Output of mask circuit 700, namely, address locking signal 502, is sourced from common node 707.

FIG. 9 is a table diagram depicting an exemplary embodiment of states of inputs and in response the output of masking circuit 700 of FIG. 8. When global masking signal 505 is logic high and address signal 302 is logic low, output signal 501 is a "don't care" ("X") and address locking signal 502 provides an address ("A"). When output signal 501 is logic high and address signal 302 is logic low, global masking signal 505 is a don't care and address locking signal 502 provides an address. When global masking signal 505 and output signal 501 are both logic low and address signal 302 is logic high, address locking signal 502 is in a lock out state, namely, a zero is provided to prevent addresses from being passed to memory elements. Accordingly, address locking signal 502 may be put in a lock out state during a readback operation, such as may be used in checking for SEUs.

Figure 11A:
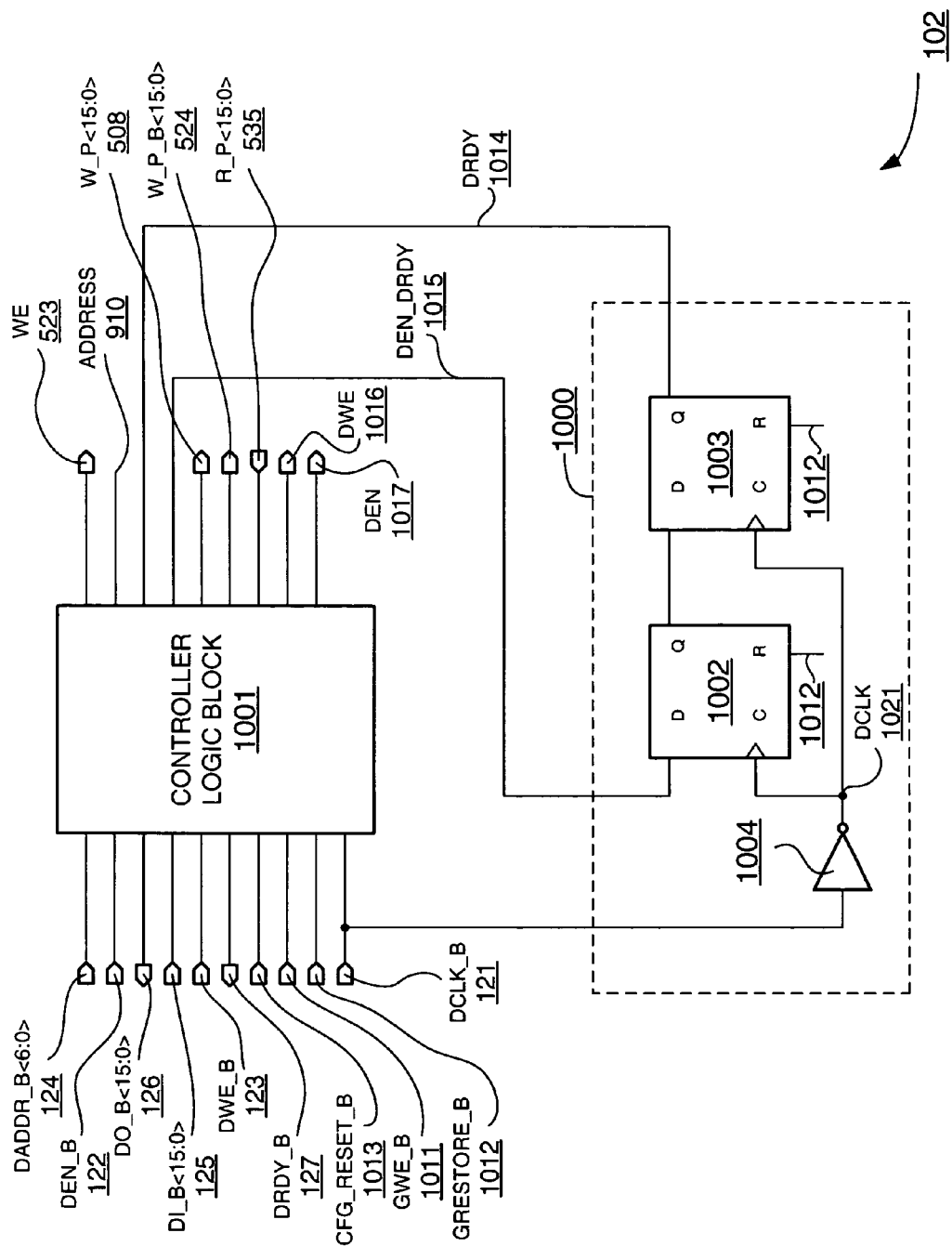
FIG. 11A is a block/schematic diagram depicting an exemplary embodiment of the reconfiguration controller of FIG. 2A.

FIG. 11A is a block/schematic diagram depicting an exemplary embodiment of controller 102. Controller 102 includes controller logic block 1001, and may separately include data ready signal generator 1000.

In this exemplary embodiment, data ready signal ("DRDY") 1014 is generated from complemented data clock signal 121 and data enable data ready ("DEN_DRDY") signal 1015 provided to data ready signal generator 1000. Data ready signal generator 1000 includes flip-flops 1002 and 1003 connected in series and inverter 1004. Complemented data clock signal 121 is provided to an input of inverter 1004 to provide a data clock signal 1021 for clocking flip-flops 1002 and 1003.

Data enable data ready signal 1015 is provided to a data input port of flip-flop 1002, which in response to data enable data ready signal 1015 and a data clock signal 1021 input, provides an output to a data input of flip-flop 1003. Flip-flop 1003 in response to receiving output data from flip-flop 1002 and a data clock signal 1021 input provides an output which is data ready signal 1014. Notably, having two flip-flops in series, namely, two stages of flip-flops, ensures that data ready signal 1014 will not be earlier than at least two clock cycles of data clock signal 121. Data enable data ready signal 1015, may be a pipelined signal, as described below in additional detail, thereby adding at least one other clock cycle prior to indicating that controller 102 is ready for a next operation. In other words, data ready signal 1014 may be produced from at least three stages of flip-flops, which ensures at least three clock cycles of data clock signal 1021 transpire prior to indicating controller 102 is ready for a next operation. However, as illustratively shown in FIGS. 3A and 3B, a data enable pulse for a next operation may or may not happen in the same clock cycle as data ready is received out.

Notably, signaling for controller 102 may be pipelined at or about the operating frequency of integrated circuit 100. During a read operation, output is driven by reading a memory element, which may take some time to be read out. With respect to write operations, they may be done within a single clock cycle as memory elements are relatively easy to flip. Furthermore, because a read-modify-write sequence to one or more memory cells may be used, a single memory cell may be changed at a time by reading 16 memory cells and writing the same value back into all but one of the memory cells.

Because a relatively small portion of memory cells may be used for dynamically reconfigurable configuration bits, FPGA 100 may be dynamically reconfigured using such portion of memory cells at speeds proximal or equal to frequency of operation of FPGA 100. Additionally, providing a data ready signal allows for faster data clock speeds interfacing to different blocks each of which return a data ready signal subject to their respective operating parameters.

Controller logic block 1001 receives or outputs complemented data address signal 124, complemented data enable signal 122, complemented data output signal 126, complemented data input signal 125, complemented data write enable signal 123, complemented data ready signal 127, complemented data clock signal 121, write enable signal 523, address signal 910, data ready signal 1014, write port signal 508, complemented write port signal 524, and read port signal 535, all of which have previously been described. Additionally, controller logic block 1001 receives complemented configuration reset signal ("CFG_RESET_B") 1013, complemented global write enable signal ("GWE_B") 1011 and complemented global restore signal ("GRE-STORE_B") 1012. In addition to use for controller logic block 1001, these three global signals 1011, 1012 and 1013 act as a chip-wide read or write enable.

Global write enable signal 1011 may be invoked to disable dynamic writing to all memory elements of FPGA 100 to allow for a conventional configuration of FPGA 100, whether externally though a configuration bit interface or internally through an ICAP. As mentioned above, memory elements may be coupled to registers, such as flip-flops, to store bit values. To write such stored bit values back to such registers, global restore signal 1012 may be invoked. Global restore signal 1012 may be provided to flip-flops 1002 and 1003 as a reset signal input. Configuration reset signal 1013 may be used to reset registers or flip-flops when the entire FPGA is being reset.

Controller logic block 1001 outputs data write enable signal 1016 and data enable signal 1017. Data write enable signal 1016 and data enable signal 1017 may be pipelined. Furthermore, address or data address signal 910 and data enable ready signal 1015 may be pipelined.

Figure 11B:
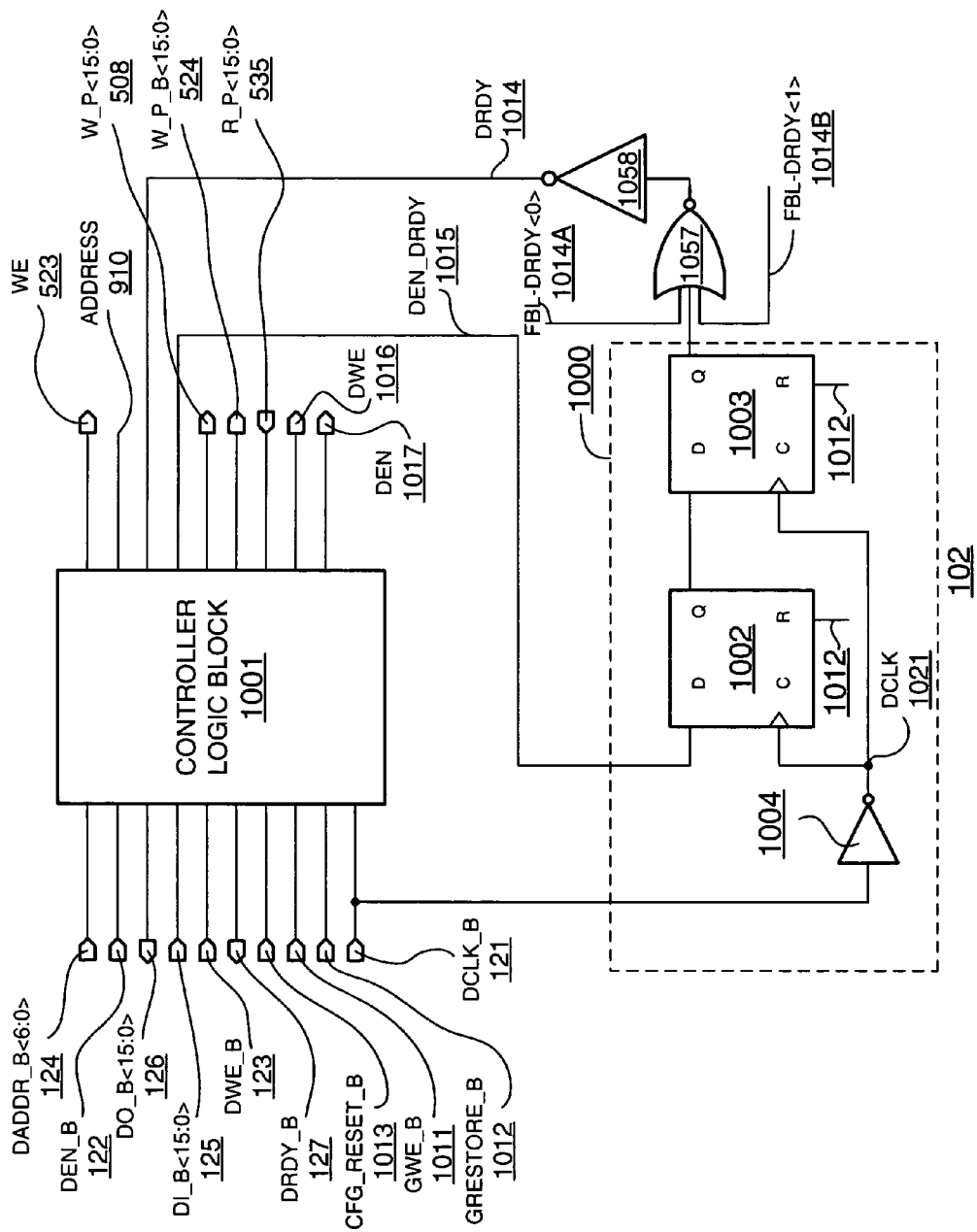
FIG. 11B is a block/schematic diagram depicting an alternate exemplary embodiment of the reconfiguration controller of FIG. 2A.

Notably, different function logic blocks may use different means for obtaining a pipelined data ready signal. FIG. 11B is a block/schematic diagram depicting an exemplary alternate embodiment of controller 102. In this embodiment, NOR gate 1057 and inverter 1058 have been added.

Inputs to NOR gate 1057 are output of flip-flop 1003 and function block logic data ready signals ("FBL-DRDY") 1014A and 1014B. Signal 1014A is a first ("<0>") bit and signal 1014B is a second ("<1>") bit of function block logic data ready signals. Output from NOR gate 1057 is provided to inverter 1058, and the output of inverter 1058 is data ready signal 1014. Thus, function block logic control signals, such as signals 1014A and 1014B, may be used to provide data ready signal 1014.

Figure 12:
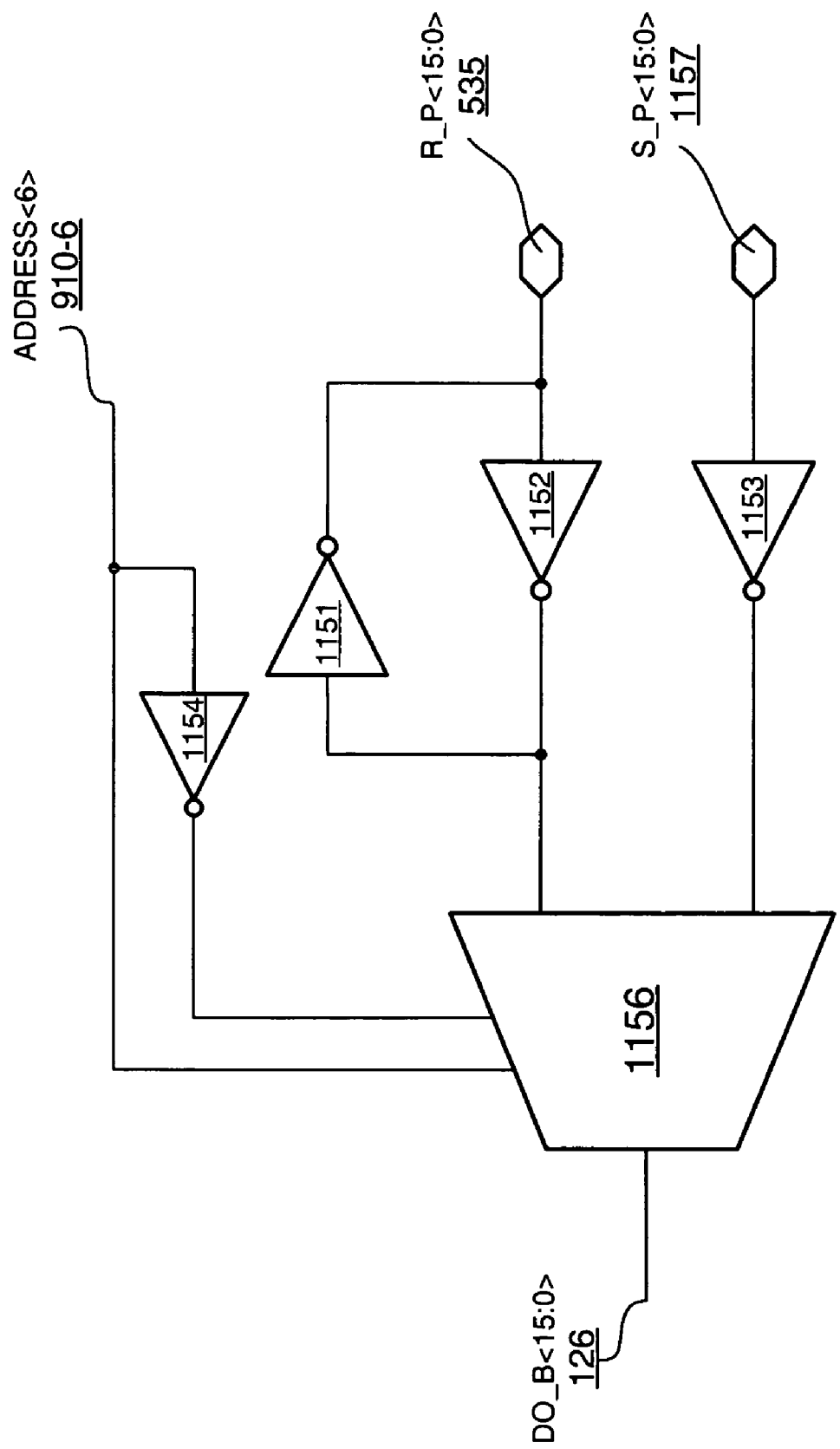
FIGS. 12A through 12F are schematic diagrams depicting an exemplary embodiment of logic for the reconfiguration controller of FIG. 2A.

FIGS. 12A through 12F are schematic diagrams depicting an exemplary embodiment of logic for controller 102 of FIG. 11A. With reference to FIG. 12A, complemented configuration reset signal 1013 and complemented global restore signal 1012 are input to NAND gate 1111. Output of NAND gate 1111 is reset signal 1101.

With reference to FIG. 12B, complemented data enable signal 122 and complemented global write enable signal 1011 are input to NOR gate 1112. Output of NOR gate 1112 is data enable signal 1102.

With simultaneous reference to FIGS. 12C through 12E, flip-flops 1122, 1132, 1141, and 1142 are in a single delay stage, namely, they are all clocked off of data clock signal 1021. Thus, flip-flops 1122, 1132, 1141, and 1142 collectively form a pipeline, and outputs of flip-flops 1122, 1132, 1141, and 1142 are pipelined. Each of flip-flops 1122, 1132, 1141, and 1142 is reset with reset signal 1101. Each of flip-flops 1122, 1132, and 1141 has a clock enable input coupled for receiving data enable signal 1102. Notably, because the data input to flip-flop 1142 is data enable signal 1102, a clock enable input need not, though may be, included with flip-flop 1142 for receiving data enable signal 1102. Notably, flip-flops 1122 and 1132 are used to implement registers. Moreover, though D-type flip-flops are illustratively shown, other known types of flip-flops may be used.

With reference to FIG. 12C, complemented data input signal 125 is input to inverter 1121, and the output of inverter 1121 is a data input to flip-flop 1122. The output of flip-flop 1122 is provided as an input to inverter 1123. The output from inverter 1123 is tapped as complemented write port signal 524 and is input to inverter 1124. The output of inverter 1124 is write port signal 508. Thus, write port signals 508 and 524 in combination provide a differential write port.

With reference to FIG. 12D, complemented data address signal 124 is an input to inverter 1131. The output from inverter 1131 is provided as a data input to flip-flop 1132. Output of flip-flop 1132 is address signal 910. Notably, address signal 911 input to column decoder 902 of FIG. 10 may be similarly obtained by providing an inverted data address signal, a data enable signal, a data clock signal and a reset signal to a register, such as a flip-flop configured like flip-flop 1132.

With reference to FIG. 12E, complemented data write enable signal 123 is provided as an input to inverter 1149. The output from inverter 1149 is provided as a data input to flip-flop 1141. The output of flip-flop 1141 is data write enable signal 1016. As mentioned above, the data input to flip-flop 1142 is data enable signal 1102. The output of flip-flop 1142 is data enable signal 1017.

If a status signal output, rather than a read memory cell output is to be obtained, memory enable is disabled. This may be done by toggling a data enable data ready signal 1015 responsive to whether either a status signal or a read memory state is to be output. Data enable signal 1017 is provided as an input to NAND gate 1145. Another input to NAND gate 1145 is an address bit to indicate whether either status or memory state is to be output. Output of NAND gate 1145 is provided as an input to inverter 1146. The output of inverter 1146 is data enable data ready signal 1015.

For purposes of clarity by way of example and not limitation, a seventh bit of address signal 910 (recall it was assumed that address signal was seven bits <6:0>) may be used, namely, pipelined address signal ("ADDRESS<6>") 910-6, as an input to NAND gate 1145. Of course, other addressing schemes may be used to toggle between status and memory states.

Assume that if a bit value of address signal 910-6 is a logic zero, that a status signal is to be read by controller 102 of FIG. 2A. Thus, as long as memory state is to be read, address signal 910-6 will be a logic one. Accordingly, output of NAND gate 1145 will be a logic one responsive to data enable signal 1017 indicating that memory is to be accessed, namely, a logic one, and address signal 910-6 is held at a logic one. Thus, output of inverter 1146 will be a logic zero indicating that data to be read from memory is enabled. If, however, address signal 910-6 is a logic zero, output from NAND gate 1145 will be a logic one and output from inverter 1146 will be a logic zero indicating that accessing state from memory is disabled.

Inputs to NAND gate 1143 are pipelined data write enable signal 1016, pipelined address signal 910-6, pipelined data enable signal 1017, and complemented data clock signal 121. The output of NAND gate 1143 is provided as an input to inverter 1144. The output of inverter 1144 is write enable signal 523.

All inputs to NAND gate 1143 are pipelined, except for complemented data clock signal 1021, and thus they will be approximately synchronous with one another. Moreover, as flip-flops 1132, 1141, and 1142 are clocked off of data clock signal 1021, complemented data clock signal 121 will be approximately synchronous with pipelined data write enable signal 1016, pipelined address signal 910-6, and pipelined data enable signal 1017.

Accordingly, when data write enable signal 1016, address signal 910-6, and data enable signal 1017 are all logic one, output of NAND gate will toggle with complemented data clock signal 121 though it will be the inverse value. For example, if data write enable signal 1016, address signal 910-6, and data enable signal 1017 are all logic one and complemented data clock signal is logic one, output of NAND gate 1143 will be a logic zero. For example, if data write enable signal 1016, address signal 910-6, and data enable signal 1017 are all logic one and complemented data clock signal is logic zero, output of NAND gate 1143 will be a logic one. Thus, if data write enable signal 1016, address signal 910-6, and data enable signal 1017 are all logic one, by obtaining write enable signal 523 from the output of inverter 1144, write enable signal will be a logic one when complemented data clock signal 121 is a logic one. Moreover, if data write enable signal 1016, address signal 910-6, and data enable signal 1017 are all logic one, by obtaining write enable signal 523 from the output of inverter 1144, write enable signal will be a logic zero when complemented data clock signal 121 is a logic zero.

If any of data write enable signal 1016, address signal 910-6, and data enable signal 1017 are a logic zero, output of NAND gate 1143 will be a logic one. Thus, output of inverter 1144 will be a logic zero indicating that writing is not enabled, as write enable signal 523 will be a logic zero.

Accordingly, it should be appreciated that by using clocked latches, such as flip-flops, for pipelining to obtain write port signals 508 and 524, data write enable signal 1016, address signal 910, and data enable signal 1017, and thus obtain write enable signal 523 as described above, write access of memory may be done at the same frequency of operation of the integrated circuit in which the memory is disposed.

With reference to FIG. 12F, read port signal 535 is provided as an input to inverter 1152, and the output of inverter 1152 is provided as an input to multiplexer 1156 and an input to inverter 1151. The output of inverter 1151 is provided as a feedback input to inverter 1152 to form a relatively weak latch to prevent the read port signal 535 node from floating when not driven. Status port signal ("S_P<15: 0>") 1157 is provided to an input of inverter 1153, and the output of inverter 1153 is provided as an input to multiplexer 1156. Data output signal 126 is selected as either data read from memory cells, namely, sourced from read port signal 535, or status state obtained, namely, sourced from status port signal 1157. This selection is done with an address bit, namely address bit signal ("ADDRESS<6>") 910-6 which is input as a control signal to multiplexer 1156. To ensure this operation is done properly, optionally address signal 910-6 may be input to inverter 1154, and the output of inverter 1154 may be provided as a control signal input to multiplexer 1156 in addition to address signal 910-6.

Figure 13:
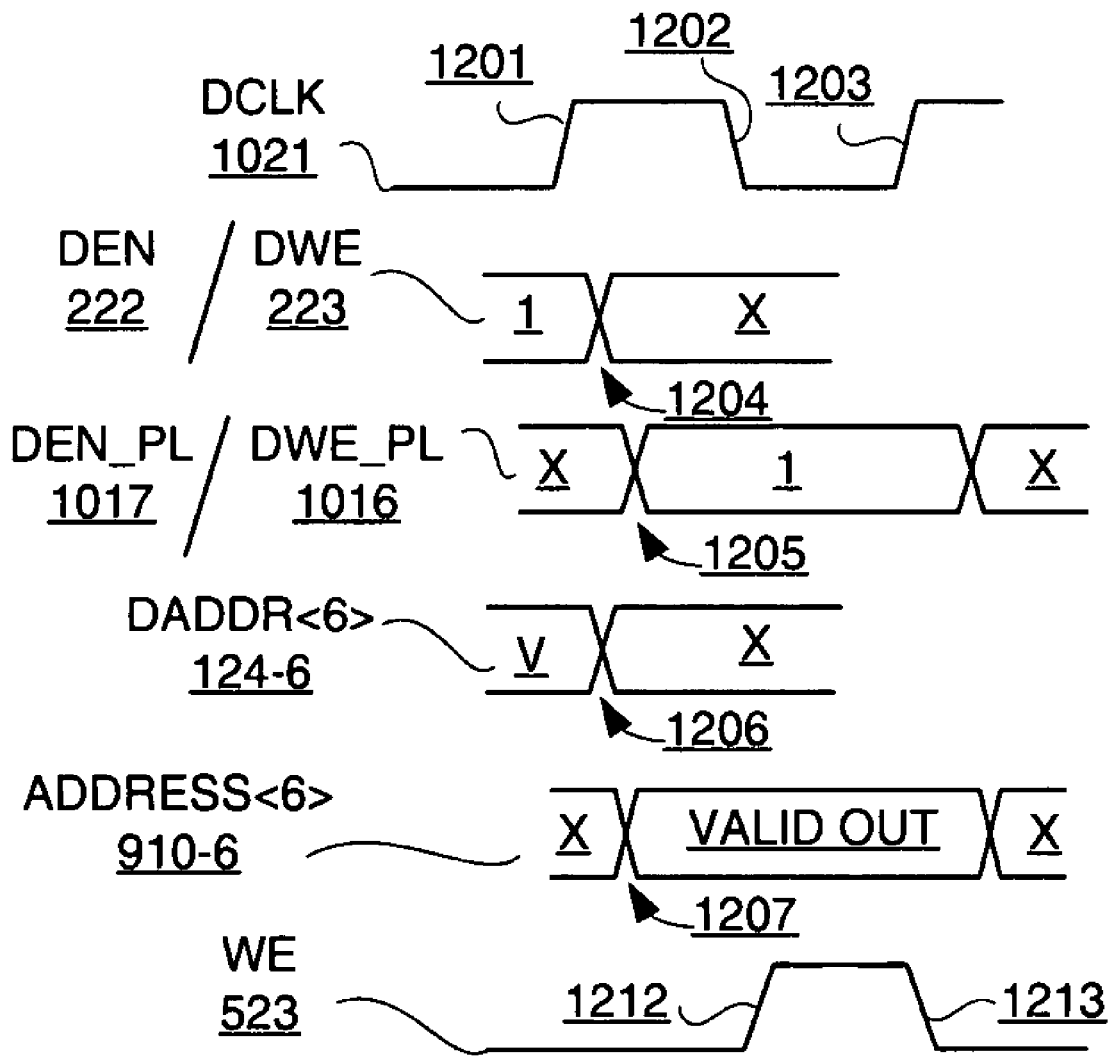
FIG. 13 is a timing diagram depicting an exemplary embodiment of signal timing in part for a write enable signal.

FIG. 13 is a timing diagram depicting an exemplary embodiment of signal timing in part for write enable signal 523. The following description assumes rising edge triggering, unless falling edge triggering is expressly described.

Prior to transfer over to the pipeline, data enable signal 222 and data write enable signal 223 may be logic one state, and data address valid signal ("DADDR<6>") 124-6 is valid. Signals 222, 223 and 124-6 may be clocked by an external clock signal (not shown) which may be the source of data clock signal 1021.

Responsive to rising edge 1201, data enable pipeline signal 1017 and data write enable pipeline signal 1016 transition at 1205 from a don't care condition to a logic one state. Responsive to rising edge 1201, data address pipeline signal 910-6 transitions at 1207 from a don't care condition to a valid address output. Accordingly, responsive to transfer to pipelining, data enable signal 222 and data write enable signal 223 transition at 1204 to a don't care condition, and data address signal 124-6 transitions at 1206 to a don't care condition. Thus, data of data address signal 124-6 is now pipeline data of data address signal 910-6.

Write enable signal 523 goes from an off logic low state to an on logic high state responsive to falling edge 1202 of data clock signal 1021. In other words, rising edge 1212 of write enable signal 523 is responsive to falling edge 1202 of data clock signal 1021. Write enable signal 523 is held in a logic high state until a next rising edge 1203 of data clock signal 1021. In other words, falling edge 1213 of write enable signal 523 is responsive to rising edge 1203 of data clock signal 1021. Thus, write enable signal 523 is active for approximately one-half of a clock cycle of data clock signal 1021. Responsive to such next rising edge 1203 of data clock signal 1021, pipeline signals 1016, 1017 and 910-6 transition to don't care conditions.

Figure 14:
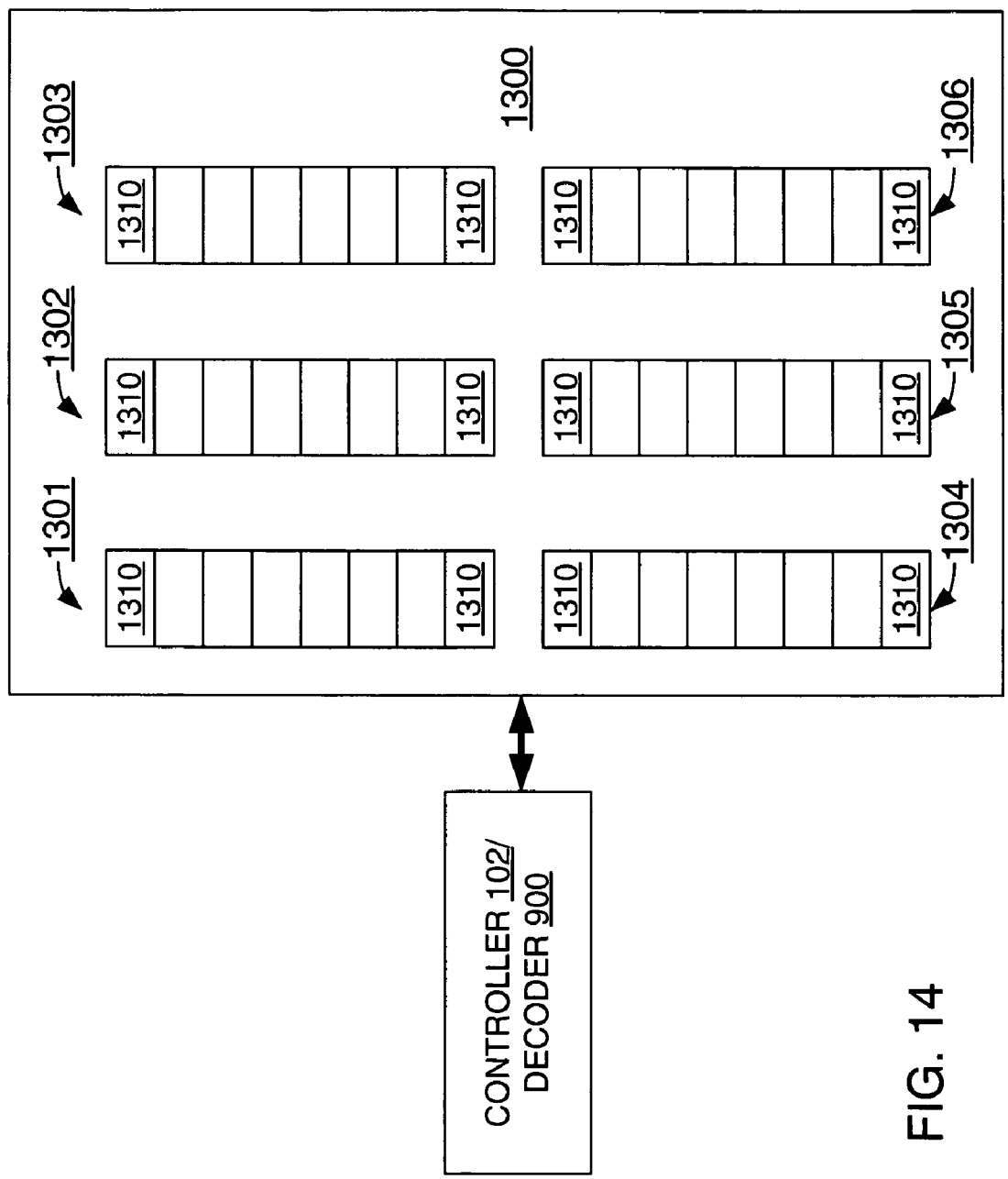
FIG. 14 is a block diagram depicting an exemplary of blocks of memory cells for a digital clock manager.

FIG. 14 is a block diagram depicting an exemplary of blocks of memory cells 1300 for a digital clock manager for function block logic 104 of FIG. 2A. Memory cells 1300 are formed into six blocks 1301 through 1306. Each sub-block 1310 of eight sub-blocks for each block 1301–1306 may include 16×6 memory cells, such that each block 1301–1306 includes 128×6 memory cells.

Controller 102 and decoder 900 may be at least approximately centrally located with respect to memory cells 1300. Notably, decoder 900 may be considered part of controller 102. With respect to address, including but not limited to row address, signaling and global masking signaling, they may be done as previously described, though for this memory array architecture. For example, an address signal A<5:0> may be used to address blocks 1301–1306 where A<0> for example is used to address a particular block. One unique y-bit out of column signal 922 of FIG. 10 is routed to each block 1301–1306 for block addressing. Write port signal 508 and read port signal 535 are shorted across all six columns of blocks 1301–1306.

Additional, digital clock manager logic may be used to interact with above-described data address and data ready signaling. Read data and data ready signals may be ready two clock cycles after a data enable signal.

Figure 15:
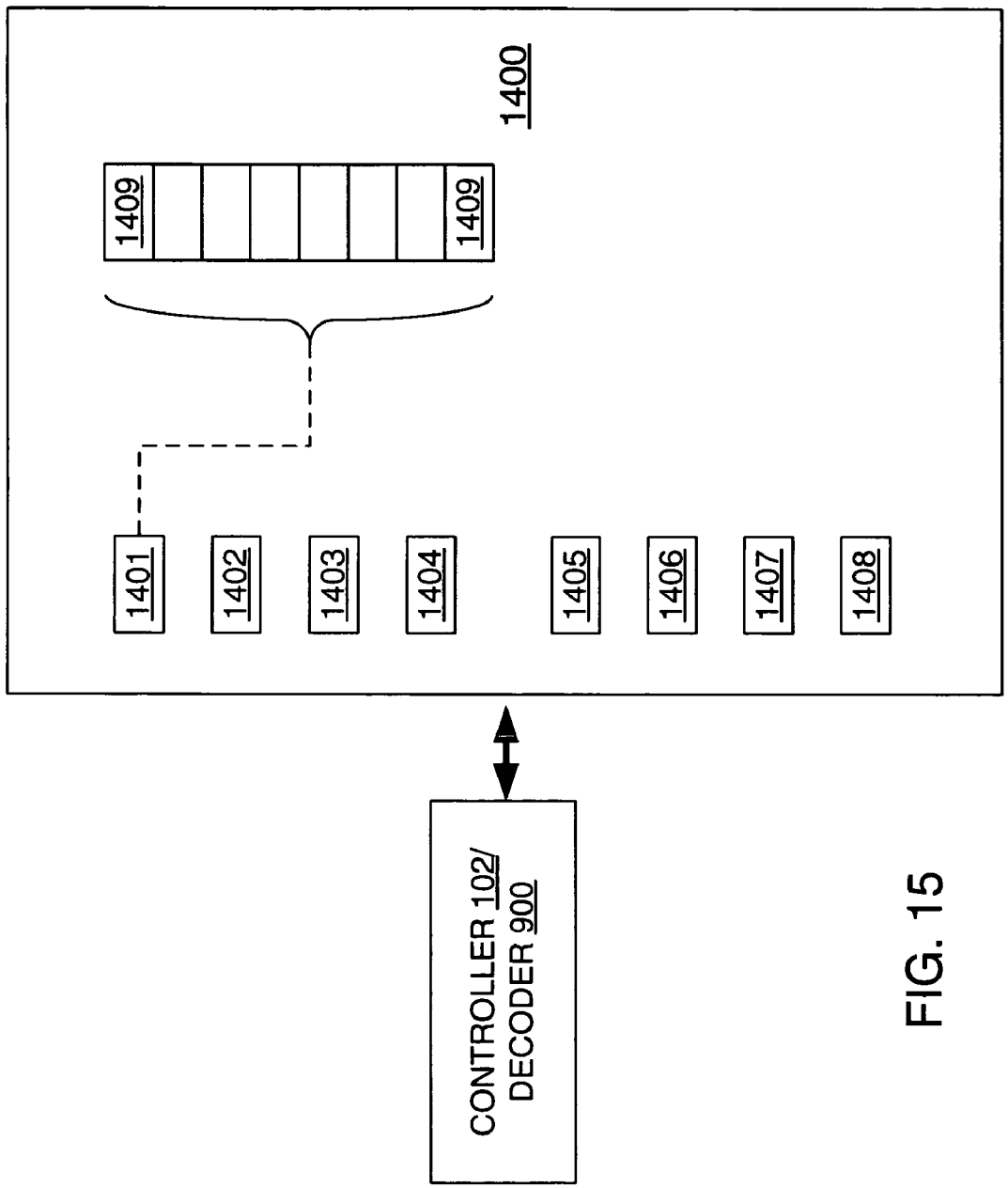
FIG. 15 is a block diagram depicting an exemplary of blocks of memory cells for a multi-gigabit transceiver.

FIG. 15 is a block diagram depicting an exemplary of blocks of memory cells for a multi-gigabit transceiver for function block logic 104 of FIG. 2A. Memory cells 1400 are formed into eight blocks 1401 through 1408. Each block 1401–1408 includes eight sub-blocks 1409. Each sub-block 1409 may include 128×6 memory cells.

Controller 102 and decoder 900 may be at least approximately centrally located with respect to memory cells 1300. A bit of address signal 910 of FIG. 10, such as A<2>, is used to address particular blocks, such as blocks 1404 and 1405. Row address signal 921, write port signal 508 and read port signal 535 are coupled to blocks 1404–1405 to automatically rotate/short through a column.

One unique y-bit out of column address signal 922 is routed to each block 1401–1408 for block addressing. Read data and data ready signals may be ready two clock cycles after a data enable signal.

Figure 16:
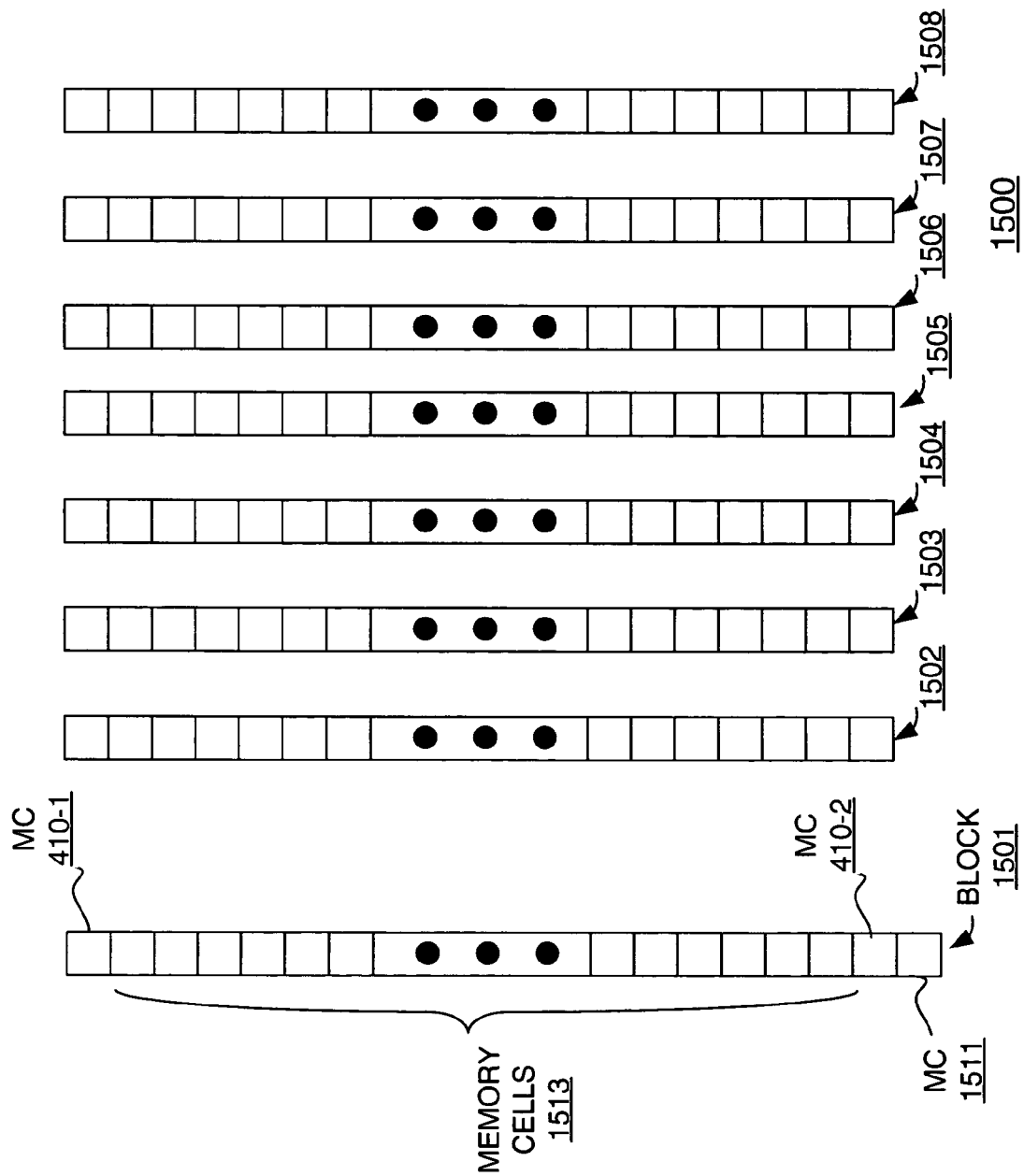
FIG. 16 is a block diagram depicting an exemplary of blocks of memory cells for a system monitor.

FIG. 16 is a block diagram depicting an exemplary of blocks of memory cells 1500 for a system monitor for function block logic 104 of FIG. 2A. There are eight blocks 1501–1508 and eight address lines to address the eight blocks. An extra-memory cell 1511 in one of the blocks, such as block 1501, in combination with the above-described global masking signal being in a logic low state are used to mask all of memory cells during dynamic reconfiguration via reconfiguration port 101. There may be 32 memory cells for memory cells 1513. Two stages of multiplexers may be used for read multiplexing.

Figure 17:
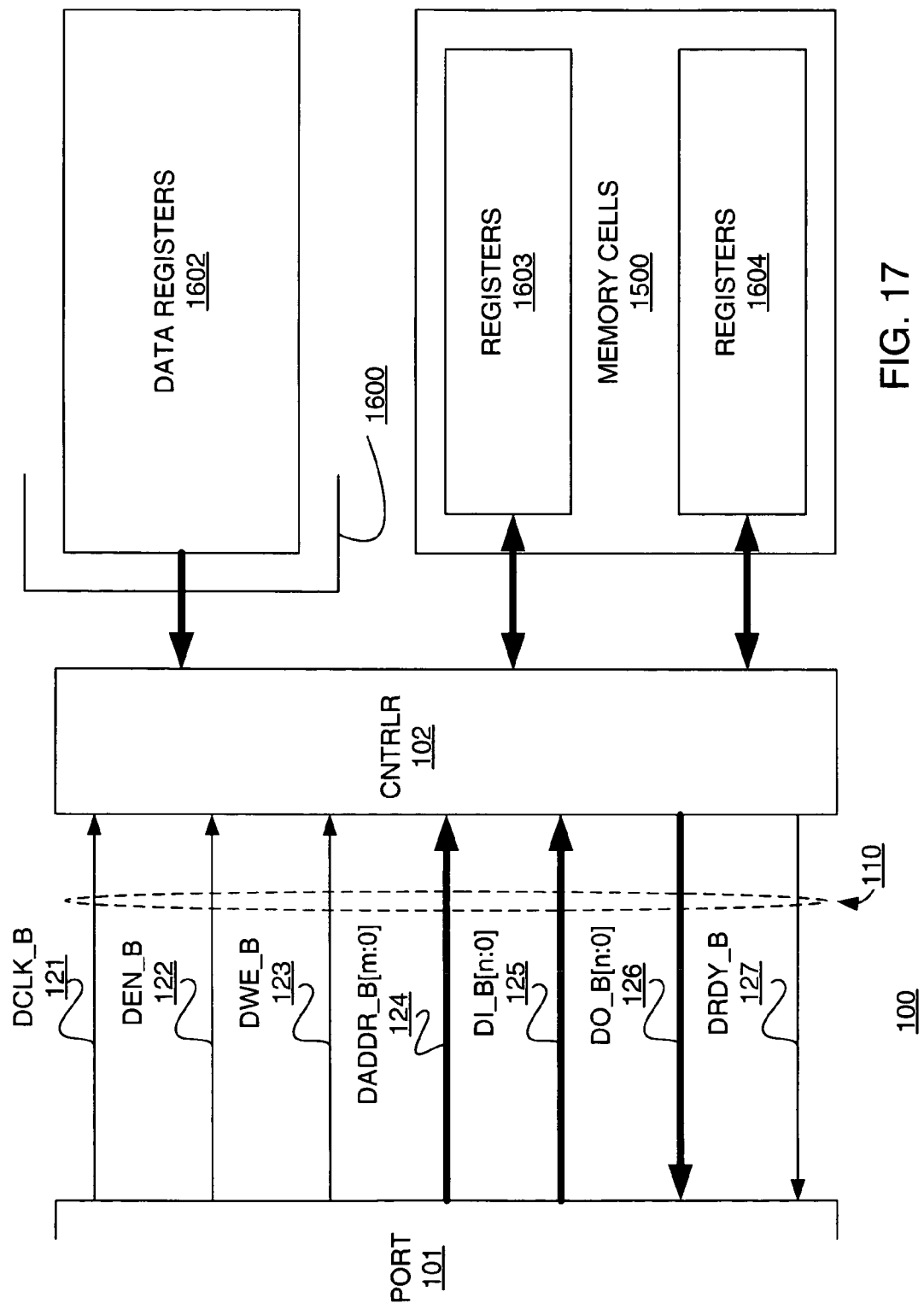
FIG. 17 is a block diagram depicting an exemplary embodiment of an interface between a dynamic reconfiguration port and a system monitor.

FIG. 17 is a block diagram depicting an exemplary embodiment of an interface between a dynamic reconfiguration port 101 and a system monitor 1600 (a portion of which is shown). System monitor 1600 includes in part data registers 1602. Data registers 1602 are status data registers, and memory cells 1500 are configuration registers. As mentioned above, separate address spaces may be used to delineate between status and configuration. Memory cells 1500 are coupled to controller 102. Memory cells 1500 may be put into one of two groups of memory registers, namely, registers 1603 and registers 1604. Registers 1603 and 1604 may be used to dynamically reconfigure system monitor 1600, as well as to store alarm threshold values for monitored parameters.

Registers 1603 and 1604, accessed via reconfiguration port 101 through controller 102, may be initially set with default settings obtained from a configuration bitstream. Thus, system monitor 1600 may start in a known state. Additionally, alarm values to be stored in memory cells 1500 may be downloaded from FPGA 100 configuration memory.

Registers 1603 include system monitor configuration registers, test registers and channel sequence registers. Registers 1604 are used to hold alarm thresholds for a digital comparison and calibration coefficients for on-chip sensors.

Additional details regarding system monitor 1600 may be found in co-pending, concurrently filed patent application entitled "DYNAMIC RECONFIGURATION OF A SYSTEM MONITOR (DRPORT)" by F. Erich Goetting, et. al., which is incorporated herein by reference in its entirety.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. It should be appreciated that the above-described dynamic reconfiguration port includes a memory interface that appears like a well-known memory interface, in particular a memory interface for a BRAM of an FPGA. This facilitates compatibility with microprocessors/microcontrollers, whether formed of dedicated circuitry or configurable logic or any combination thereof. For example, a memory block may be mapped into memory or input/output space of a microprocessor. Because mapping a memory block into such space is a well-known model for on-chip control of microprocessor controlled peripherals, the above-described interface is compatible with well-known on-chip interfaces of interconnecting cores, such as a CoreConnect from IBM or AMBA from ARM.

Claim(s) listing steps do not imply any order of the steps. Trademarks are the property of their respective owners.

What is claimed is:

1. An integrated circuit, comprising:
a reconfiguration port interface internal to the integrated circuit for communication;
a controller coupled to the reconfiguration port interface, the controller for controlling the communication;
a read/write interface coupled to the controller for reading and writing configuration information;
an array of storage cells coupled to the read/write interface for storing the configuration information; and
a function logic block coupled to the array of storage cells and configurable for providing any of a variety of functions;
the array of storage cells programmable for configuring the function logic block to provide any of the variety of functions;
the reconfiguration port interface for providing the configuration information to the array of storages cells for programming at least a portion of the array of storage cells for dynamic configuration of the function logic block at a frequency of operation of the integrated circuit.

2. The integrated circuit, according to claim 1, wherein the array of storage cells comprises an array of configuration memory cells.

3. The integrated circuit, according to claim 1, wherein the array of storage cells comprises an array of non-volatile memory cells.

4. The integrated circuit, according to claim 1, wherein the array of storage cells comprises an array of volatile memory cells.

5. The integrated circuit, according to claim 2, wherein the integrated circuit is a programmable logic device.

6. The integrated circuit, according to claim 3, wherein the programmable logic device is a field programmable gate array.

7. The integrated circuit, according to claim 2, wherein the integrated circuit is an application specific integrated circuit.

8. The integrated circuit, according to claim 2, wherein the integrated circuit is a microprocessor.

9. The integrated circuit, according to claim 1, wherein the reconfiguration port interface is coupled to a reconfiguration port to for communication of a data clock signal, a data enable signal, a data write enable signal, data address signaling, and data input signaling to the controller.

10. The integrated circuit, according to claim 9, wherein the controller is coupled to the reconfiguration port to provide data output signaling and a data ready signal to the reconfiguration port.

11. The integrated circuit, according to claim 1, wherein the controller is part of a function block of the integrated circuit including the function logic block.

12. The integrated circuit, according to claim 11, wherein the function logic block comprises a digital signal processor.

13. The integrated circuit, according to claim 11, wherein the function logic block comprises a multi-gigabit transceiver.

14. The integrated circuit, according to claim 11, wherein the function logic block comprises a system monitor.

15. The integrated circuit, according to claim 11, wherein the function logic block comprises a digital clock manager.

16. The integrated circuit, according to claim 11, wherein the function logic block comprises an interconnect switch matrix including at least one programmable interconnect point.

17. The integrated circuit, according to claim 11, wherein the array of storage cells is arrayed for the function logic block.

18. A method for configuring a function block, comprising:
configuring an integrated circuit device including the function block;
operating the integrated circuit device;
while operating the integrated circuit device, reconfiguring the function block, the reconfiguring including:
accessing a reconfiguration port internal to the integrated circuit device; and
writing configuration information via the reconfiguration port to configuration memory cells for the reconfiguring of the function block, the configuration memory cells being dual ported, a port of the configuration memory cells for configuring configurable logic of the integrated circuit device, another port of the configuration memory cells for configuring the function block, the writing via the other port of the configuration memory cells.

19. The method, according to claim 18, wherein the operating of the integrated circuit is at a frequency of operation of the integrated circuit.

20. The method, according to claim 19, wherein the frequency of operation is in excess of approximately 500 MHz.

21. The method, according to claim 18, further comprising generating a data ready signal responsive to completion of the writing.

22. An integrated circuit, comprising:
a reconfiguration port;
a controller coupled to the reconfiguration port; and
an array of memory cells, a portion of the array of memory cells coupled for read/write communication with the controller, another portion of the array of memory cells not coupled for read/write communication with the controller, the portion of the array of memory cells configurable at an operational frequency of the integrated circuit for dynamic reconfiguration of a function block of the integrated circuit.

23. The integrated circuit, according to claim 22, wherein the portion of the array of memory cells comprises dual ported memory cells.

24. The integrated circuit, according to claim 23, wherein the dual ported memory cells are dual ported static random access memory cells.

25. The integrated circuit, according to claim 22, wherein the integrated circuit is a programmable logic device.

26. The integrated circuit, according to claim 25, wherein the array of memory cells are configuration memory cells, the configuration memory cells for storing configuration information for programmable logic of the programmable logic device.

27. An integrated circuit, comprising:
reconfiguration port means for reading and writing information to memory;
controller means coupled to the reconfiguration port means, the controller means for controlling the reading and writing to the memory; and
an array of memory cells of the memory, a portion of the array of memory cells coupled for read/write communication with the controller, another portion of the array of memory cells not coupled for read/write communication with the controller, the portion of the array of memory cells configurable at an operational frequency of the integrated circuit for dynamic reconfiguration of a function block of the integrated circuit.

28. An apparatus for configuring a function block, comprising:
means for configuring an integrated circuit device including the function block;
means for operating the integrated circuit device;
means for reconfiguring the function block while operating the integrated circuit device, the reconfiguring means including:
means for accessing a reconfiguration port internal to the integrated circuit device; and
means for writing configuration information via the reconfiguration port to configuration memory cells for the reconfiguring of the function block, the configuration memory cells being dual ported, a port of the configuration memory cells for configuring configurable logic of the integrated circuit device, another port of the configuration memory cells for configuring the function block, the writing via the other port of the configuration memory cells.

29. An integrated circuit, comprising:
reconfiguration port interface means internal to the integrated circuit for communication;
controller means coupled to the reconfiguration port interface for controlling the communication;
read/write interface means coupled to the controller means for reading and writing configuration information;
an array of storage cells coupled to the read/write interface for storing the configuration information; and
function logic means coupled to the array of storage cells and configurable for any of a variety of functions;
the array of storage cells programmable for configuring the function logic means to provide any of the variety of functions;
the reconfiguration port interface means for providing the configuration information to the array of storages cells for programming at least a portion of the array of storage cells for dynamic configuration of the function logic means at a frequency of operation of the integrated circuit.

30. The integrated circuit, according to claim 29, wherein the read/write interface means is compatible with at least one conventional on-chip interface.

31. The integrated circuit, according to claim 30, wherein the read/write interface provides for mapping of a memory block into microprocessor memory space.

* * * * *